United States Patent
Kinney et al.

(10) Patent No.: US 11,170,852 B1
(45) Date of Patent: Nov. 9, 2021

(54) CROSS-BAR ARRAYS HAVING STEERING ELEMENT WITH DIODE

(71) Applicant: SanDisk Technologies LLC, Addison, TX (US)

(72) Inventors: Justin Phillip Kinney, San Jose, CA (US); Daniel Bedau, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/910,871

(22) Filed: Jun. 24, 2020

(51) Int. Cl.
  *G11C 7/00* (2006.01)
  *G11C 13/00* (2006.01)
  *G11C 11/16* (2006.01)

(52) U.S. Cl.
  CPC ........ *G11C 13/003* (2013.01); *G11C 11/1659* (2013.01); *G11C 11/1673* (2013.01); *G11C 11/1675* (2013.01); *G11C 13/004* (2013.01); *G11C 13/0069* (2013.01); *G11C 2013/0045* (2013.01); *G11C 2013/0078* (2013.01); *G11C 2213/72* (2013.01); *G11C 2213/74* (2013.01); *G11C 2213/76* (2013.01); *G11C 2213/79* (2013.01)

(58) Field of Classification Search
  CPC .............. G11C 13/003; G11C 11/1659; G11C 11/1673; G11C 11/1675
  USPC .................................................... 365/189.14
  See application file for complete search history.

(56) References Cited

U.S. PATENT DOCUMENTS

| | | | |
|---|---|---|---|
| 8,289,749 B2 | 10/2012 | Chen et al. | |
| 8,441,839 B2* | 5/2013 | Azuma | G11C 13/0069 365/148 |
| 8,575,715 B2 | 11/2013 | Mihnea et al. | |
| 8,933,429 B2 | 1/2015 | Ananthan et al. | |
| 9,312,005 B2 | 4/2016 | Castro | |
| 2020/0219574 A1* | 7/2020 | Chung | G11C 29/027 |

OTHER PUBLICATIONS

Waser, Rainer, et al., "Nanoionics-based resistive switching memories," Nature Materials, vol. 6, Nov. 2007, 8 pages.

* cited by examiner

*Primary Examiner* — Vu A Le
(74) *Attorney, Agent, or Firm* — Vierra Magen Marcus LLP

(57) ABSTRACT

Technology for operating cross-bar arrays is disclosed herein. The memory cells may each have a reversible resistivity element and a steering element comprising a diode. The cross-bar array may be operated in read mode and a bipolar programming mode. Selected memory cells may be sensed by operating the steering elements such that sense currents pass through the diodes and any sneak currents are blocked by the diodes. During bipolar programming of selected memory cells, the steering element of the selected memory cells allows current to flow in either direction through the steering element to permit bipolar programming. In some aspects, the steering element has a switch in parallel with the diode. The switches may be opened when sensing selected memory cells to pass sense currents and block sneak currents with the diodes. The switches may be closed during bipolar programming of the selected memory cells to allow bi-directional current flow.

20 Claims, 23 Drawing Sheets

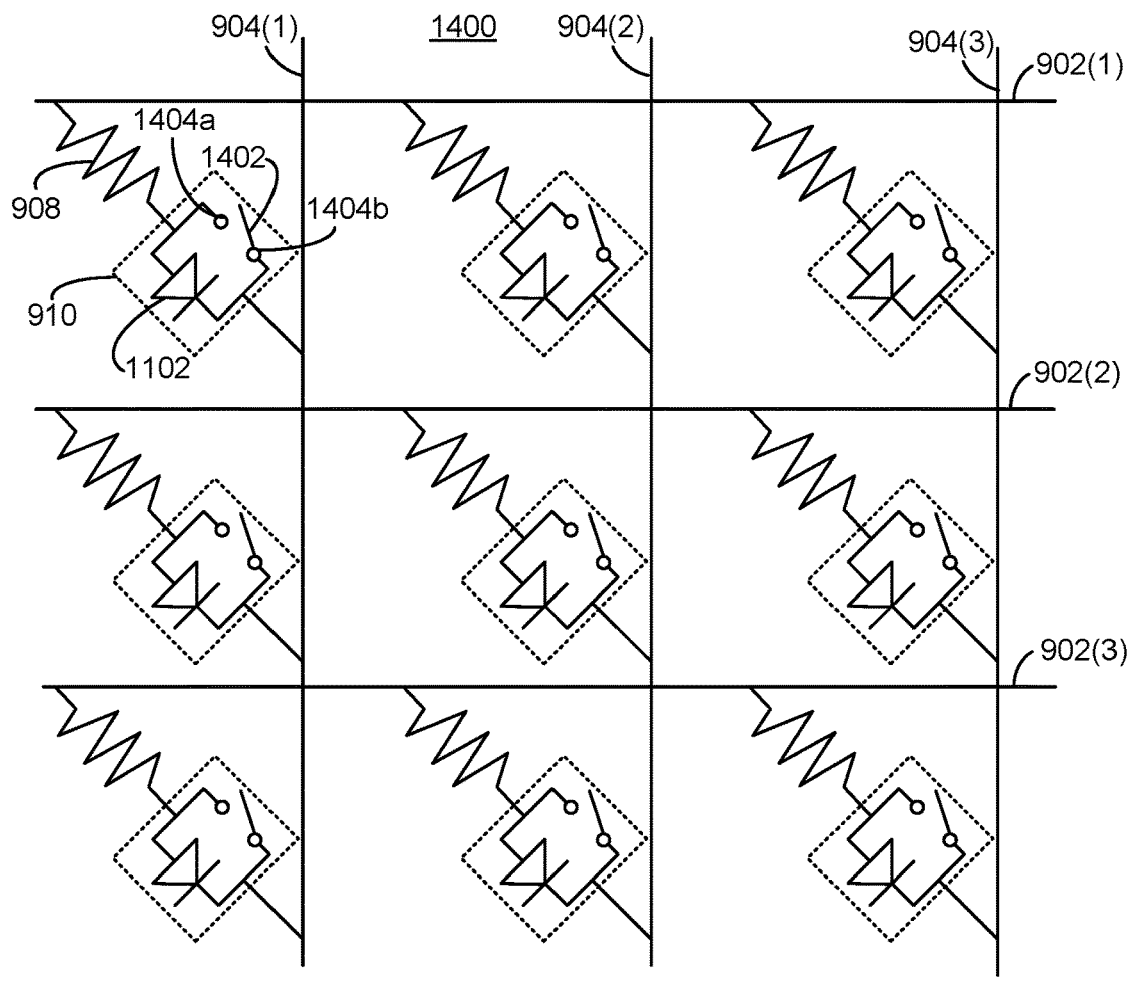
FIG. 14
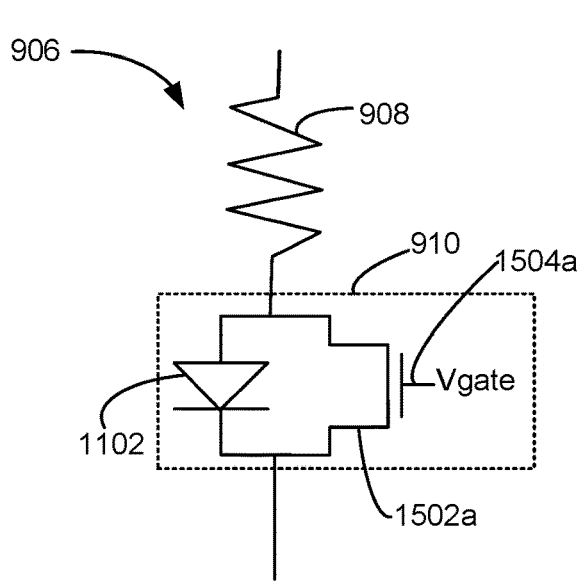
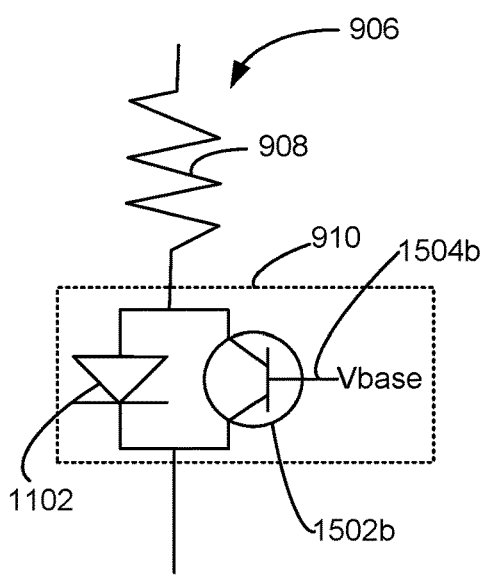
FIG. 15A  FIG. 15B

CROSS-BAR ARRAYS HAVING STEERING ELEMENT WITH DIODE

BACKGROUND

In the quest for ever increasing storage density, resistive switching memory elements have been proposed. Each memory cell has a reversible resistivity element capable of being placed at a high resistivity state (HRS, e.g., a logic "0" state) or a low resistivity state (LRS, e.g., a logic "1" state) by applying suitable voltages or currents. For example, voltage pulses are generally used to switch the reversible resistivity element from one resistivity state to the other.

Some reversible resistivity elements are programmed with what is commonly referred to as bipolar programming. In bipolar programming, the low resistivity state is established by applying a voltage having one polarity and the high resistivity state is established by applying a voltage having the opposite polarity.

Cross-bar arrays have been proposed for such reversible resistivity elements. A cross-bar array may also be referred to as a cross-point array. A cross-bar array has a number of conductive X lines and conductive Y lines (e.g., word lines and bit lines). Each memory cell is connected between one of the X lines and one of the Y lines. A selected memory cell may be read by applying a suitable voltage across the selected memory cell, and then sensing a current in either the X line or the Y line. The voltage may be applied across the selected memory cell by applying a first voltage to the X line to which the selected memory cell is connected and a second voltage to the Y line to which the memory cell is connected. However, since many memory cells are connected to each X line and each Y line, there is the possibility that a voltage will be applied across other memory cells, thereby generating additional currents. Some of such currents may "sneak" into the conductive line in which the current from the selected memory cell is sensed, thereby corrupting the sensing operation of the selected memory cell.

BRIEF DESCRIPTION OF THE DRAWING

Like-numbered elements refer to common components in the different figures.

FIG. 14 depicts one embodiment of a cross-point array in which the steering element of a memory cell has a switch in parallel with a diode.

FIGS. 15A and 15B depict embodiment memory cells that may be used in the cross-bar array of FIG. 14.

DETAILED DESCRIPTION

Figure 1:
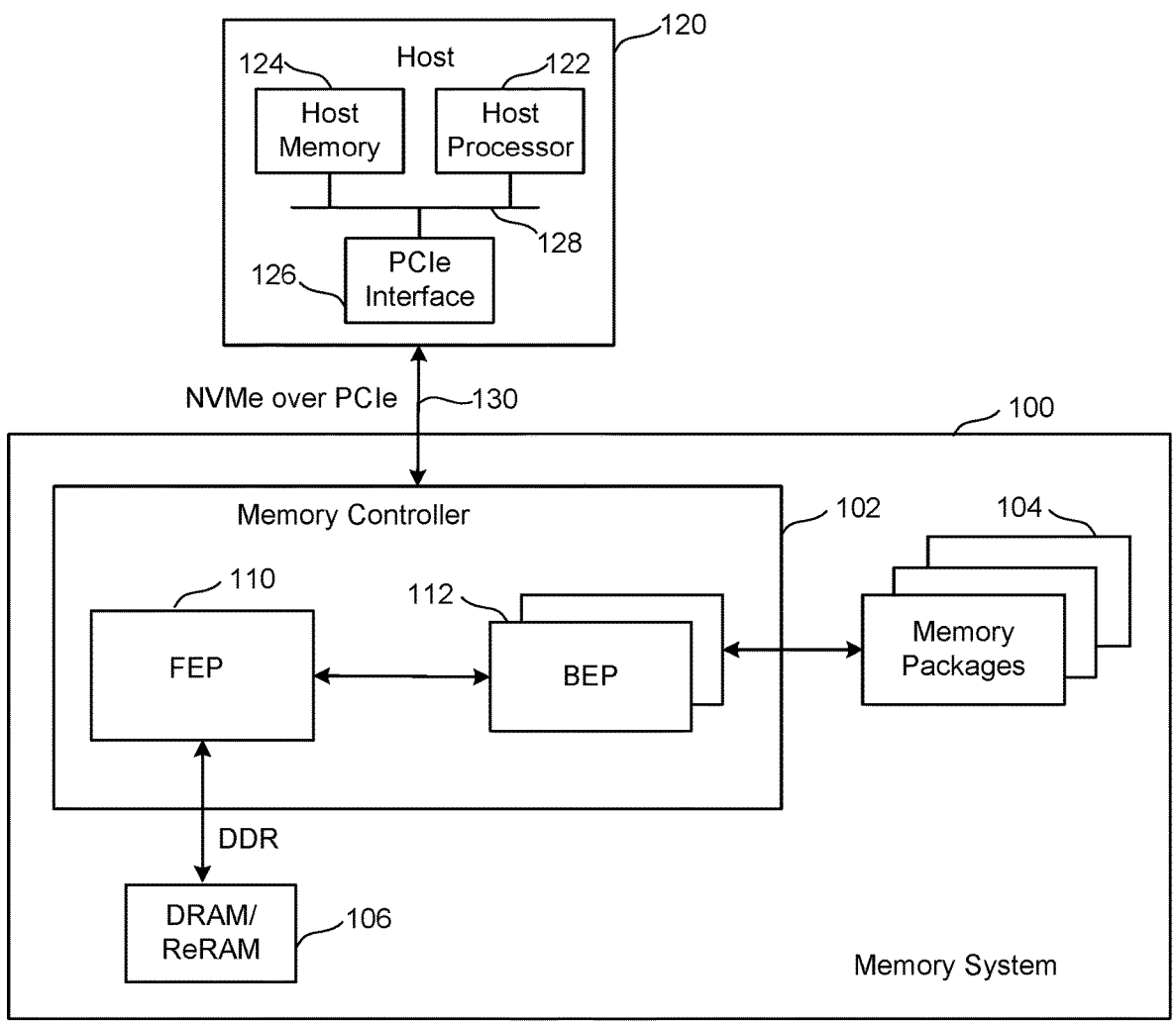
FIG. 1 is a block diagram of one embodiment of a memory system connected to a host.

Technology for operating non-volatile memory comprising cross-bar arrays is disclosed herein. In some embodiments, the memory cells each have a reversible resistivity element and a steering element comprising a diode. The diode allows current to pass in one direction, while blocking current in the opposite direction. For example, the diode allows current to pass from the anode to the cathode, but under normal operating conditions prevents current from flowing from the cathode to the anode. The steering element may have other circuit elements in addition to the diode. The steering element may be used to control a direction of current flow. In some embodiments, the cross-bar array is operated in read mode and a bipolar programming mode. In one embodiment, read selected memory cells are sensed by operating the steering elements such that sense currents pass through the diodes and any sneak currents are blocked by the diodes. Herein, a "read selected memory cell" is a memory cell whose physical state is sensed in a read or sense operation. In one embodiment, during bipolar programming of program selected memory cells, the steering element of the program selected memory cells allows current to flow in either direction through the steering element to permit the bipolar programming. Herein, a "program selected memory cell" is a memory cell whose physical state is established in a programming operation. Herein, an "unselected memory cell" is a memory cell other than a read selected memory cell in a sense (or read) operation, or is a memory cell other than a program selected memory cell in a program operation. The term "selected memory cell" may be used to refer to either a read selected memory cell or to a program selected memory cell.

In some embodiments, the steering element has a switch in parallel with the diode. The switches may be open (also referred to as in a non-conductive state) when sensing read selected memory cells to place the reversible resistivity element of each memory cell (both the read selected memory cells, as well as unselected memory cells) in series with the diode in the steering element of the memory cell such that the diodes pass the sense currents and block any sneak currents. The switches may be closed (also referred to as in a conductive state) during bipolar programming of the program selected memory cells. Therefore, for one polarity of program voltage, current may pass in one direction through the steering element, and for the other polarity of program voltage, current may pass in the other direction through the steering element.

In some embodiments, the switch in the steering element comprises a transistor in parallel with the diode. A voltage may be applied to a control terminal of the transistor to control whether the transistor is in the conductive state (corresponding to the switch being closed) or the non-conductive state (corresponding to the switch being open).

In some embodiments, the switch in the steering element comprises a photo-transistor in parallel with the diode. By controlling a light source, the photo-transistor may be placed in either the conductive state (corresponding to the switch being closed) or the non-conductive state (corresponding to the switch being open).

In some embodiments, the switch in the steering element comprises a magneto-resistor in parallel with the diode. By controlling a magnetic field source, the magneto-resistor may be placed in either the conductive state (corresponding to the switch being closed) or the non-conductive state (corresponding to the switch being open).

In some embodiments, the steering element does not have a switch in parallel with the diode. In one embodiment, the diode in each steering element comprises a photo-diode. By controlling a light source, the photo-diode may be placed into a conductive state. In the conductive state, the photo-diode may pass a current in either direction (anode-to-cathode, or cathode-to-anode). Hence, the photo-diode permits bipolar programming of the memory cells. Also, by controlling a light source, the photo-diode may be placed into a mode in which the photo-diode is controlled by a voltage that appears between the anode and cathode of the photo-diode. In such a "voltage-controlled mode", the photo-diode may pass a current from anode-to-cathode, but block currents from cathode-to-anode. Hence, the photo-diode in the voltage-controlled mode may pass a sense current but block a sneak current.

In some embodiments, multiple columns of memory cells are read in parallel. Reading multiple columns of memory cells in parallel can be a challenge for an architecture that allows bipolar programming and that blocks sneak currents during sensing.

In some embodiments, in-memory computing is performed in the cross-bar array. An example of in-memory computing is analog multiplication. Analog multiplication may be performed in a neuromorphic computing system. In some embodiments, vector/vector multiplication is performed. In some embodiments, vector/matrix multiplication is performed.

In some embodiments, each memory cell is programmed to one of two physical states. Herein, a "physical state" may be referred to more briefly as a "state." In some embodiments, one state may be referred to as an "on-state" and the other state as an "off-state." The on-state is a "high current state," whereas the off-state is a "low current state," in one embodiment. In one embodiment, the on-state is a "low resistivity state," whereas the off-state is a "high resistivity state." One state may be used to store a "1" and the other to store a "0." Thus, in some embodiments, each memory cell stores one bit of information.

Upon application of sufficient voltage, current, or other stimulus, the reversible resistivity-switching material switches to a stable low-resistivity state, which is sometimes referred to as SETTING the device. This resistivity-switching is reversible such that subsequent application of an appropriate voltage, current, or other stimulus can serve to return the reversible resistivity-switching material to a stable high-resistivity state, which is sometimes referred to as RESETTING the device. This conversion can be repeated many times. The low resistivity state is sometimes referred to as an "on" state. The high resistivity state is sometimes referred to as an "off" state.

FIGS. 1-5D depict a memory system in which embodiments disclosed herein may be performed. FIG. 1 is a block diagram of one embodiment of a memory system 100 connected to a host 120. Memory system 100 can implement the technology proposed herein. In one embodiment, neural network inputs or other data are received from the host 120. Depending on the embodiment, the inputs can be received from the host 120 and then provided to the memory packages 104 for inferencing on the weights programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Memory Controller 102, memory packages 104 (which may contain non-volatile memory) for storing data, and local memory (e.g. DRAM/ReRAM) 106. Memory Controller 102 comprises a Front End Processor (FEP) circuit 110 and one or more Back End Processor (BEP) circuits 112. In one embodiment, FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, there are a plurality of memory packages 104. Each memory package includes one or more memory die. Therefore, Memory Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Memory Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
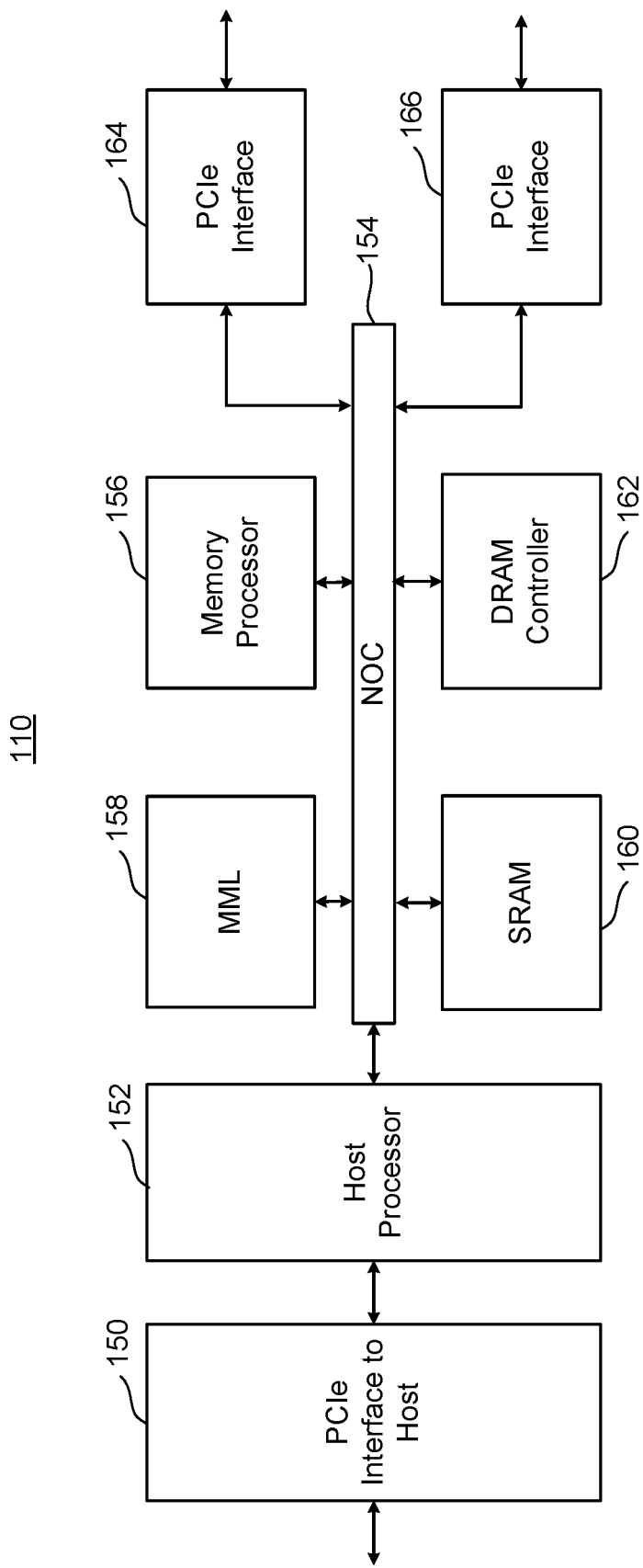
FIG. 2 is a block diagram of one embodiment of a Front End Processor Circuit. In some embodiments, the Front End Processor Circuit is part of a Memory Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 506 of FIG. 5A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
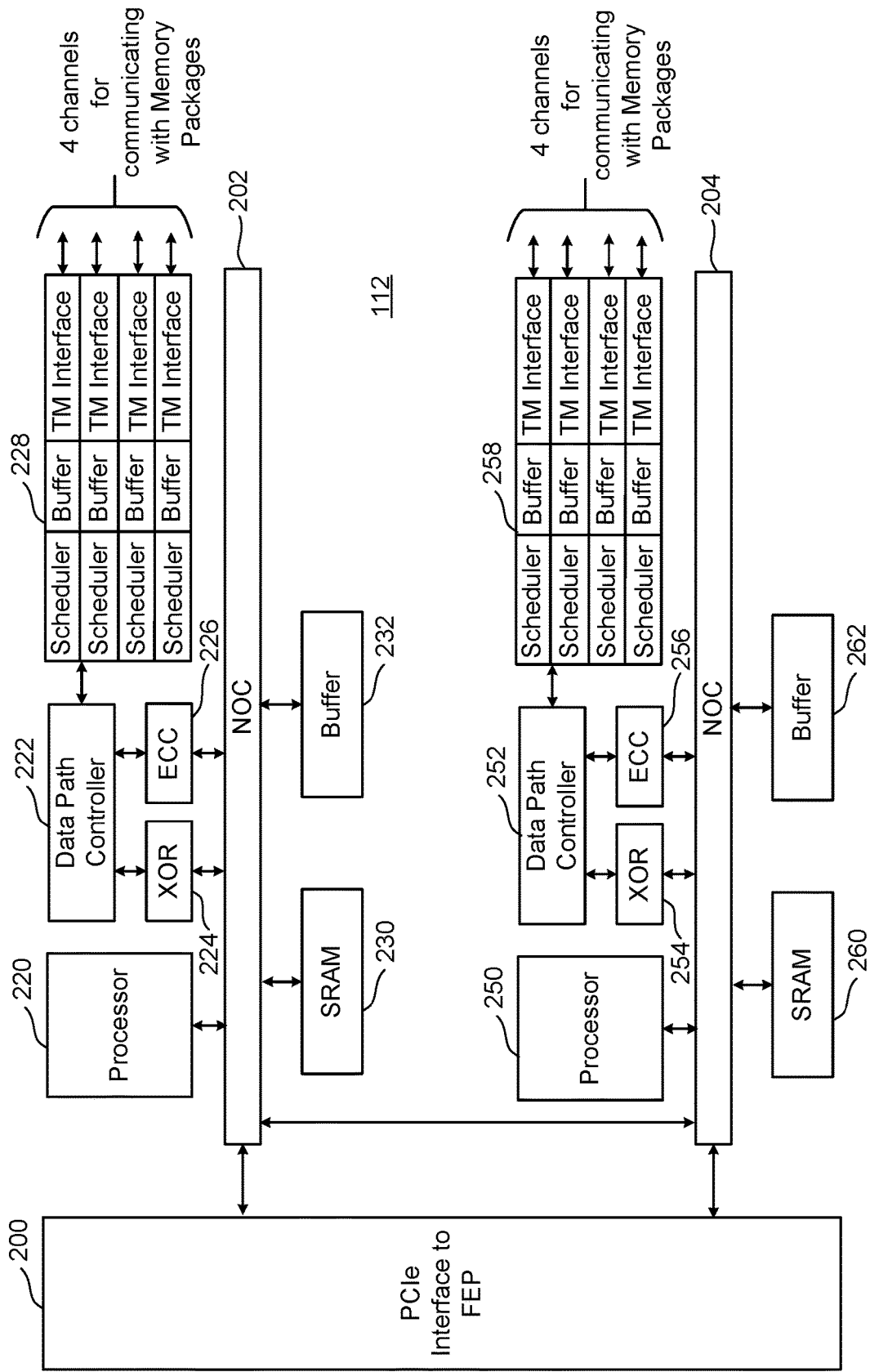
FIG. 3 is a block diagram of one embodiment of a Back End Processor Circuit. In some embodiments, the Back End Processor Circuit is part of a Memory Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
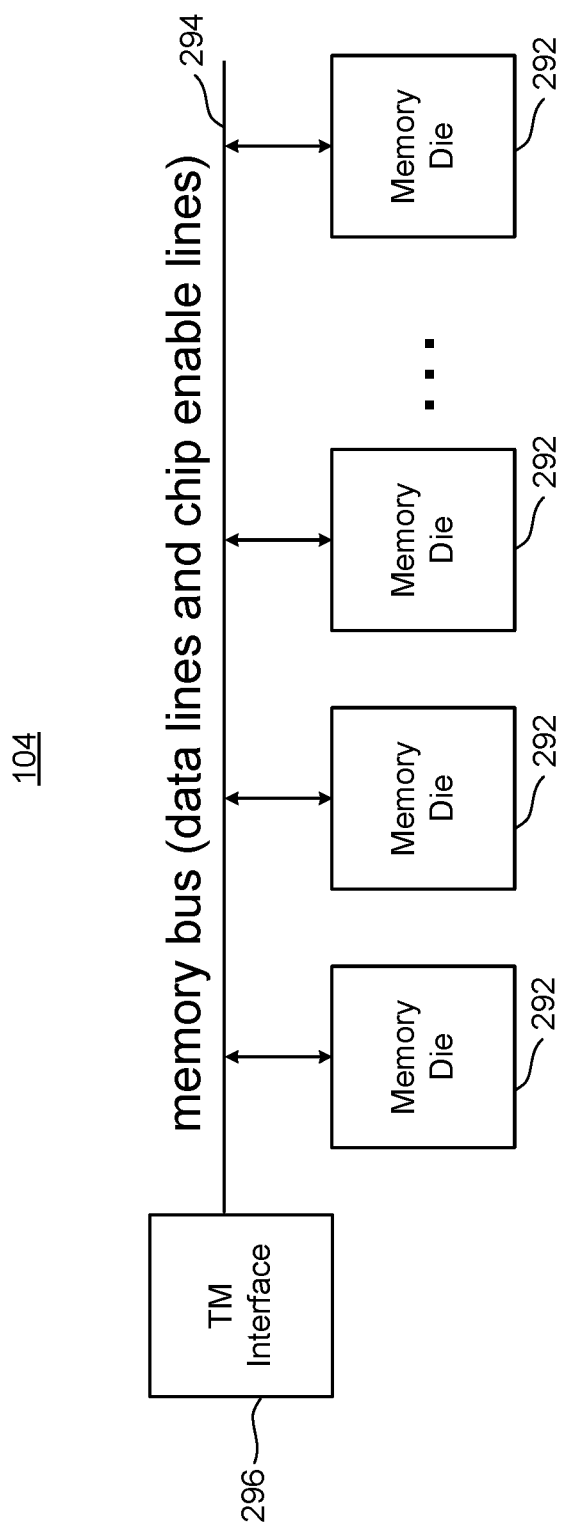
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Memory controller 102 may include one or more state machines, page registers, SRAM, and control circuitry for controlling the operation of memory die 292. The one or more state machines, page registers, SRAM, and control circuitry for controlling the operation of memory die 292 may be referred to as managing or control circuits. The managing or control circuits may facilitate one or more memory array operations, such as forming, erasing, programming, or reading (or sensing) operations. The managing or control circuits are used to perform multiplication using non-volatile memory cells, in one embodiment. Herein, multiplication will be referred to as a type of memory array operation.

In some embodiments, the managing or control circuits (or a portion of the managing or control circuits) for facilitating one or more memory array operations (including multiplication) may be integrated within memory die 292.

Figure 5A:
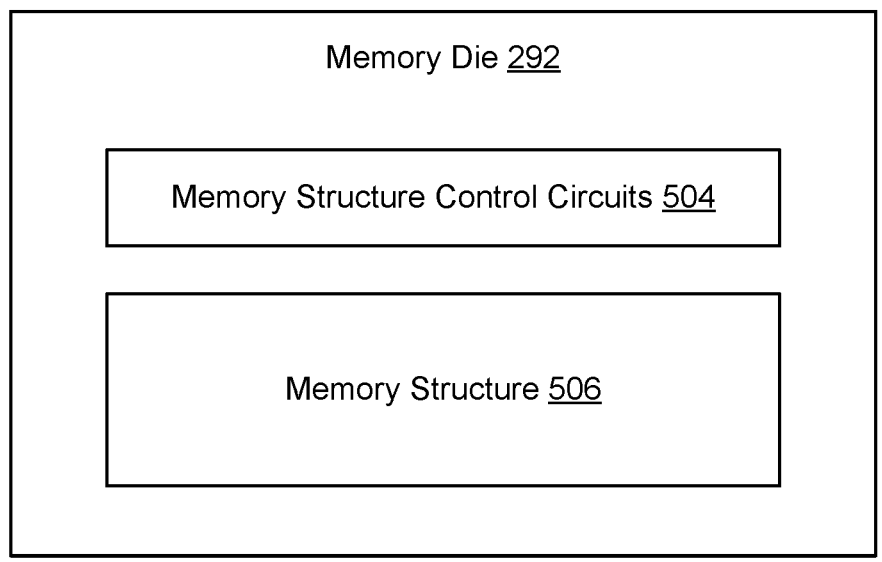
FIG. 5A depicts an embodiment of a memory die.

FIG. 5A depicts one embodiment of a memory die 292. Memory die 292 includes memory structure control circuits 504 and a memory structure 506. Memory structure control circuits 504 may include logic for controlling the selection of memory blocks (or arrays) within memory structure 506, controlling the generation of voltage references for biasing a particular memory array into a read or write state, or generating row and column addresses. Memory structure control circuits 504 may include logic for controlling the generation of voltage references for biasing a particular memory array in order to perform multiplication using non-volatile memory cells.

Memory controller 102 (see FIG. 1) controls operation of memory die 292. Once a read, write, or multiply operation is initiated by memory controller 102, memory structure control circuits 504 may generate the appropriate bias voltages for bit lines, source lines and/or word lines within memory structure 506, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an on-chip memory controller for determining row and column address, bit line, source line and word line addresses, memory array enable signals, and data latching signals.

Memory structure 506 may include one or more two-dimensional arrays of memory cells or one or more three-dimensional arrays of memory cells. In one embodiment, memory structure control circuits 504 and memory structure 506 are arranged on a single integrated circuit. In other embodiments, control circuits 504 (or a portion of memory structure control circuits 504) and memory structure 506 may be arranged on different integrated circuits.

In one embodiment, memory structure 506 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory structure 506 is not limited to the examples above. Many different types of memory array architectures or memory technologies can be used to form memory structure 506. No particular non-volatile memory technology is required for purposes of the new claimed embodiments proposed herein. Other examples of suitable technologies for memory cells of the memory structure 506 include ReRAM memories, ferroelectric field effect transistor (FeFET) memory, magneto-resistive memory (e.g., MRAM, Spin Transfer Torque MRAM, Spin Orbit Torque MRAM), phase change memory (e.g., PCM), and the like. Examples of suitable technologies for memory cell architectures of the memory structure 506 include two dimensional arrays, three dimensional arrays, cross-point arrays (also referred to as cross-bar arrays), stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magneto-resistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

In one embodiment, memory structure 506 comprises a three dimensional memory array of non-volatile memory cells in which multiple memory levels are formed above a single substrate, such as a wafer. The memory structure 506 may comprise any type of non-volatile memory that are monolithically formed in one or more physical levels of memory cells having an active area disposed above a silicon (or other type of) substrate. In another embodiment, memory structure 506 comprises a two dimensional memory array of non-volatile memory cells.

A person of ordinary skill in the art will recognize that the technology described herein is not limited to a single specific memory structure, but covers many relevant memory structures within the spirit and scope of the technology as described herein and as understood by one of ordinary skill in the art.

Figure 5B:
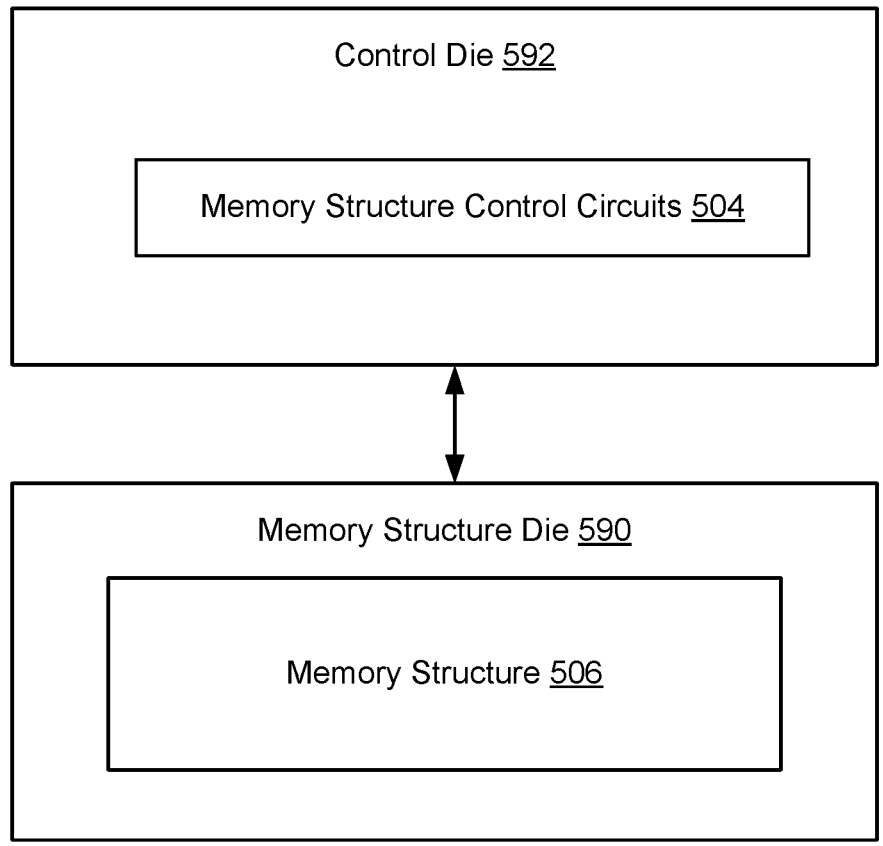
FIG. 5B depicts an embodiment of a control die and a memory structure die.

In one embedment, the memory structure 506 and the memory structure control circuits 504 reside on different semiconductor dies. FIG. 5B depicts a functional block diagram of one embodiment in which the memory structure 506 and the memory structure control circuits 504 reside on different semiconductor dies. Control die 592 contains the memory structure control circuits 504. Memory structure die 590 contains the memory structure 506. In some embodiments, the memory structure die 590 and the control die 592 are bonded together. The memory structure die 590 and the control die 592 may be used in a memory package 104 in memory system 100. In one embodiment, each memory die 292 in FIG. 4 is replaced with a memory structure die 590 that is bonded to a control die 592.

Figure 5C:
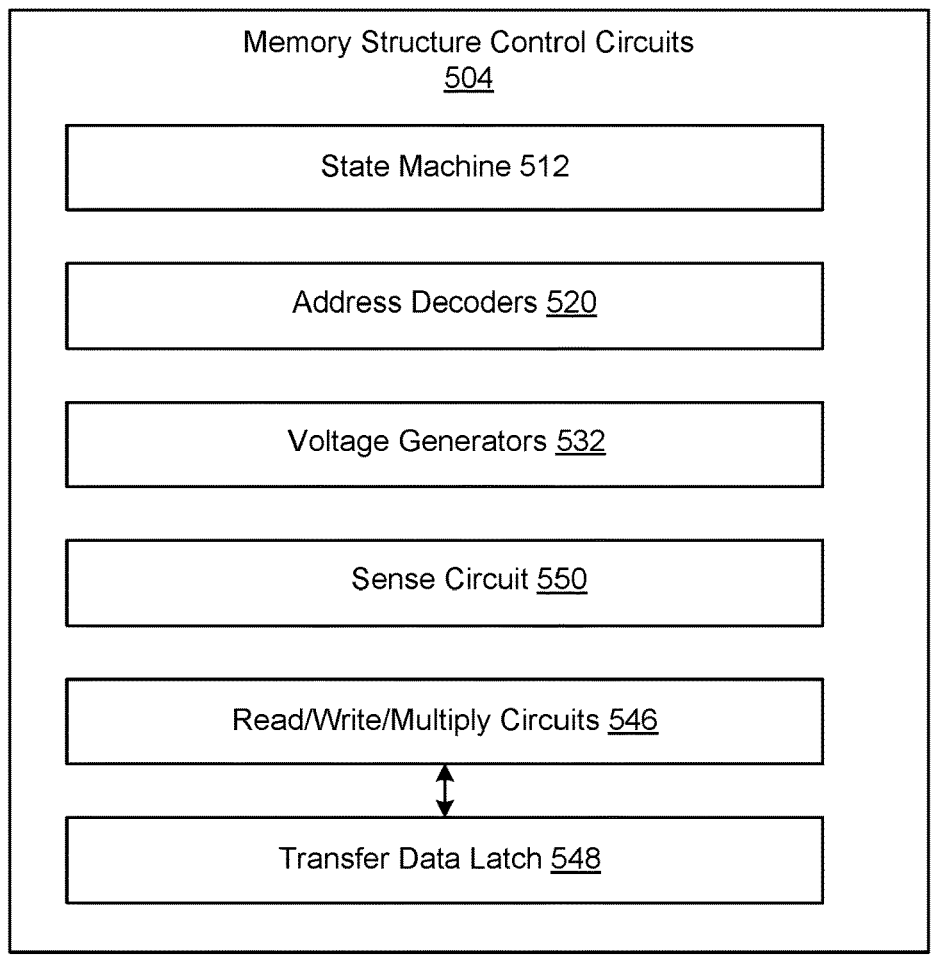
FIG. 5C depicts an embodiment of memory structure control circuits.

FIG. 5C depicts an embodiment of memory structure control circuits 504 (of either memory die 292 or control die 592). As depicted, memory structure control circuits 504 include state machine 512, address decoders 520, voltage generators 532, transfer data latch 548, read/write/multiply circuits 546, and sense circuit 550. The voltage generators (or voltage regulators) 532 may generate voltages for control lines. State machine 512 provides die-level control of memory operations. In one embodiment, state machine 512 is programmable by software. In other embodiments, state machine 512 does not use software and is completely implemented in hardware (e.g., electrical circuits). In some embodiments, state machine 512 can be replaced by a microcontroller or microprocessor.

Read/write/multiply circuits 546 include circuitry for reading and writing memory cells in the memory structure 506. In an embodiment, transfer data latch 548 is used for intermediate storage between memory controller 102 (FIG. 1) and memory cells. In an embodiment, when host 120 instructs memory controller 102 to write data to memory die 292, memory controller 102 writes host data to transfer data latch 548. Read/write circuits 546 then write data from transfer data latch 548 to a specified page of memory cells. In an embodiment, transfer data latch 548 has a size equal to the size of a page. In an embodiment, when host 120 instructs memory controller 102 to read data from memory die 292, read/write circuits 546 read from a specified page into transfer data latch 548, and memory controller 102 transfers the read data from transfer data latch 548 to host 120. Address decoders 520 may generate memory block addresses, as well as row addresses and column addresses for a particular memory block.

The read/write/multiply circuits 546 also include circuitry for performing multiply operations using memory cells. In one embodiment, the multiply circuit is used to apply multiply voltages to memory cells that store multiplicands. Each multiply voltage has a magnitude that represents a multiplier, in one embodiment. Each memory cell passes memory cell current in response to the multiply voltage. The magnitude of the memory cell current depends on the physical state of the memory cell and a magnitude of the multiply voltage, in one embodiment. For example, the magnitude of a memory cell current depends on the resistance of the memory cell and the voltage applied to the memory cell, in one embodiment. The magnitude of the memory cell current depends on whether the memory cell is in a first physical state or a second physical state, in one embodiment. Each physical state may be represented by a physical parameter including, but not limited to, a memory cell resistance.

The multiply voltage may cause the memory cell to pass the memory cell current without changing the physical state of the memory cell. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The sense circuit 550 is configured to sense the memory cell currents. The sense circuit 550 comprises a number of sense amplifiers, in one embodiment. A sense amplifier may be used to sense a current in a bit line, in one embodiment. A bit line may also be referred to as a column line or a vertical line. In some embodiments, a number of memory cells are connected to the same bit line. Depending on how voltages are applied to the memory cells by the read or multiply circuit, the current from one or more memory cells may flow in the bit line. Thus, a sense amplifier may be used to sense the memory cell current from a single memory cell, or the combined memory cell current from multiple memory cells connected to the same bit line. The sense amplifier may also be configured to compare the magnitude of the bit line current to the magnitude of a reference current. In some embodiments, the sense circuit 550 is configured to sense the current from multiple bits lines in parallel. Note that a separate sense amplifier may be used for each bit line.

In some embodiments, the memory structure control circuits 504 are configured to control a light source, which is used to control steering elements in the memory structure 506. In some embodiments, the memory structure control circuits 504 are configured to control a magnetic field source, which is used to control steering elements in the memory structure 506. For example, state machine 512 may control the light source and/or magnetic field source.

Figure 5D:
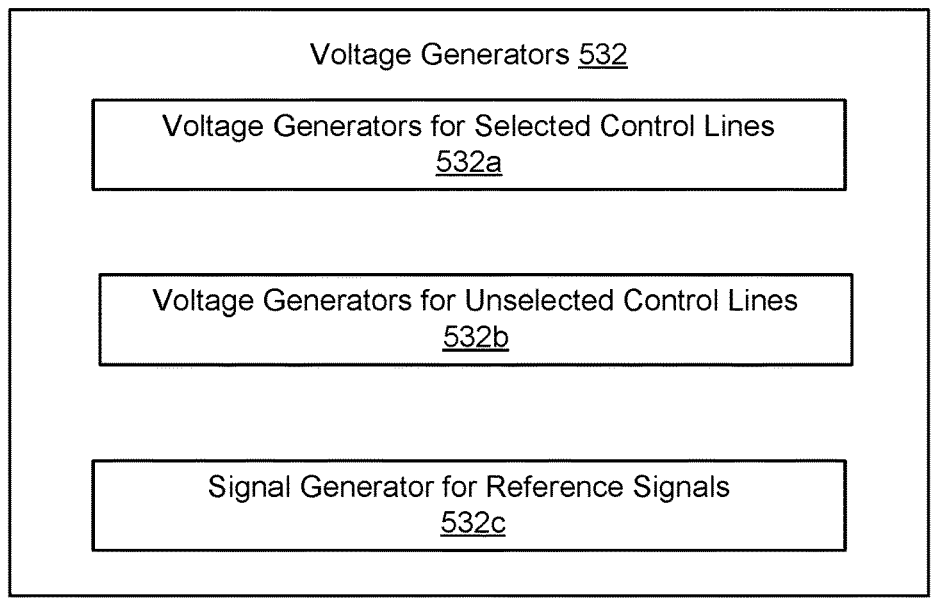
FIG. 5D depicts further details of one embodiment of voltage generators.

FIG. 5D depicts further details of one embodiment of voltage generators 532. The voltage generators include voltage generators for selected control lines 532a, voltage generators for unselected control lines 532b, and signal generators for reference signals 532c. Control lines may include bit lines, word lines, source lines, or a combination of bit lines, source lines and word lines. In some embodiments, the control lines includes lines connected to switches (e.g., transistors) in steering elements. Voltage generators for selected control lines 532a may be used to generate program, read, and/or multiply voltages. In one embodiment, the voltage generators for selected control lines 532a generate a voltage whose magnitude is based on a multiplier for a mathematical multiplication operation. In one embodiment, the voltage difference between the voltages for two selected control lines is a multiply voltage.

Voltage generators for unselected control lines 532b may be used to generate voltages for control lines that a connected to memory cells that are not selected for a program, read, or multiply operation. The signal generators for reference signals 532c may be used to generate reference signals (e.g., currents, voltages) to be used as a comparison signal to determine the physical state of a memory cell.

For purposes of this document, the phrase "a control circuit" refers to a memory controller 102, a state machine, a micro-controller and/or memory structure control circuits 504, or other analogous circuits that are used to control non-volatile memory.

Figure 6:
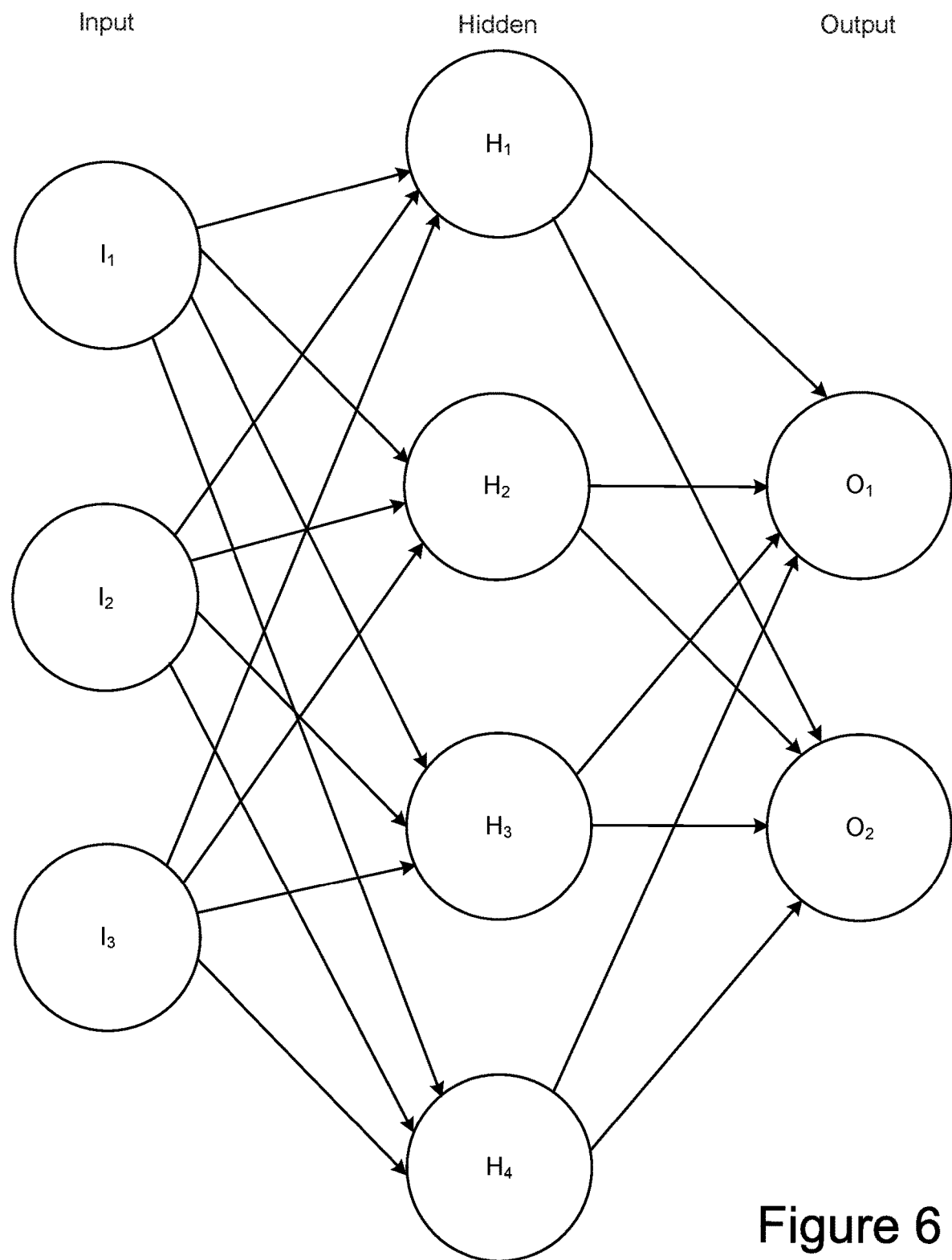
FIG. 6 illustrates a simple example of an artificial neural network.

Turning now to types of data that can be stored on non-volatile memory devices, a particular example of the type of data of interest in the following discussion is the weights used in deep neural networks. An artificial neural network is formed of one or more intermediate layers between an input layer and an output layer. The neural network finds a mathematical manipulation to turn the input into the output, moving through the layers calculating the probability of each output. FIG. 6 illustrates a simple example of an artificial neural network.

In FIG. 6 an artificial neural network is represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6 shows only a single intermediate or hidden layer, a complex deep neural network (DNN) can have many such intermediate layers.

An artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 7B:
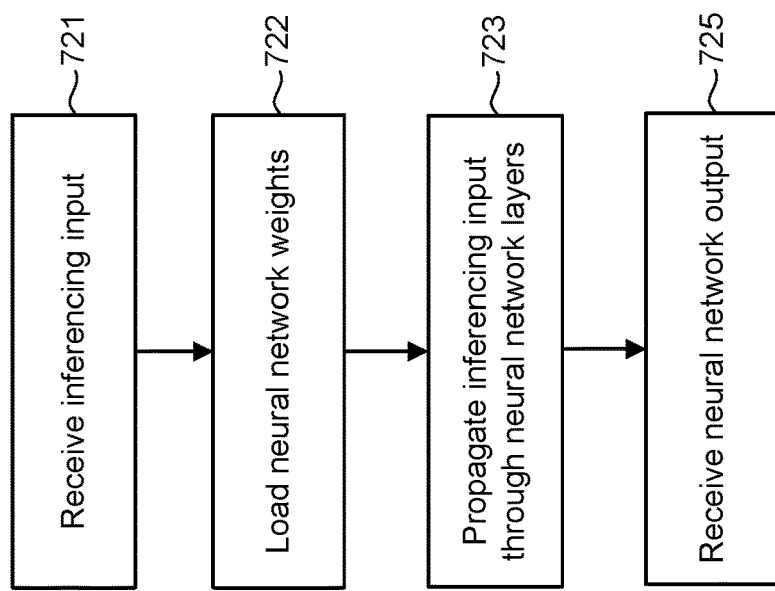
FIG. 7B is a flowchart describing one embodiment of a process for inference using a neural network.
Figure 7A:
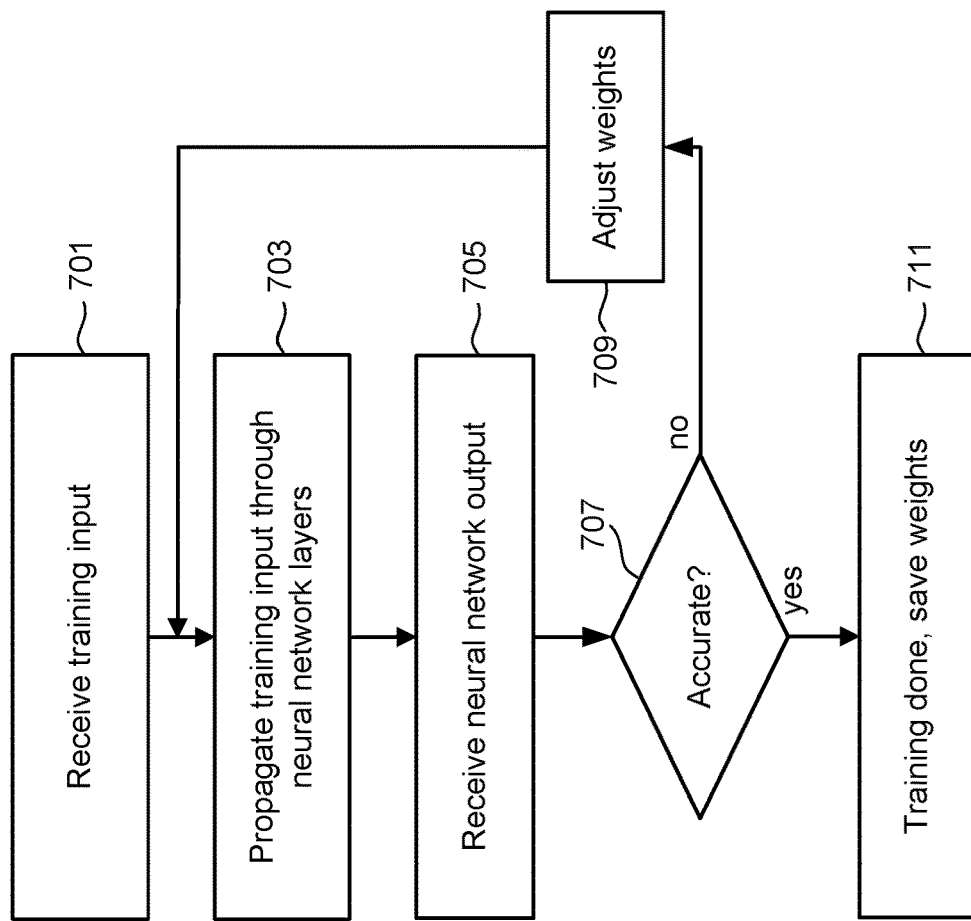
FIG. 7A is a flowchart describing one embodiment of a process for training a neural network to generate a set of weights.

FIG. 7A is a flowchart describing one embodiment of a process for training a neural network to generate a set of weights. The training process is often performed in the cloud, allowing additional or more powerful processing the accessed. At step 701, the input, such as a set of images, is received at the input nodes (e.g., $I_1$, $I_2$, $I_3$ in FIG. 6). At step 703 the input is propagated through the nodes of the hidden intermediate layers (e.g., $H_1$, $H_2$, $H_3$, $H_4$ in FIG. 6) using the current set of weights. The neural network's output is then received at the output nodes (e.g., $O_1$, $O_2$ in FIG. 6) in step 705. In the dog breed example of the preceding paragraph, the input would be the image data of a number of dogs, and the intermediate layers use the current weight values to calculate the probability that the dog in an image is a certain breed, with the proposed dog breed label returned at step 705. A user can then review the results at step 707 to select which probabilities the neural network should return and decide whether the current set of weights supply a sufficiently accurate labelling and, if so, the training is complete (step 711). If the result is not sufficiently accurate, the neural network adjusts the weights at step 709 based on the probabilities the user selected, followed by looping back to step 703 to run the input data again with the adjusted weights. Once the neural network's set of weights have been determined, they can be used for "inference," which is the process of using the determined weights to generate an output result from data input into the neural network. Once the weights are determined at step 711, they can then be stored in non-volatile memory for later use, where the storage of these weights in non-volatile memory is discussed in further detail below.

FIG. 7B is a flowchart describing a process for the inference phase of supervised learning using a neural network to classify the input data using an estimated accuracy. Depending on the case, the neural network may be used for inference both at cloud and by an edge device's (e.g., smart phone, automobile process, hardware accelerator) processor. At step 721, the input is received, such as the image of a dog in the example used above. If the previously determined weights are not present in the device running the neural network application, they are loaded at step 722. For example, on a host processor executing the neural network, the weight could be read out of an SSD in which they are stored and loaded into RAM on the host device. At step 723, the input data is then propagated through the neural network's layers. Step 723 will be similar to step 703 of FIG. 7B, but now using the weights established at the end of the training process at step 711. After propagating the input through the intermediate layer, the output is then provided at step 725.

Neural networks are typically feedforward networks in which data flows from the input layer, through the intermediate layers, and to the output layer without looping back. At first, in the training phase of supervised learning as illustrated by FIG. 7A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Figure 8:
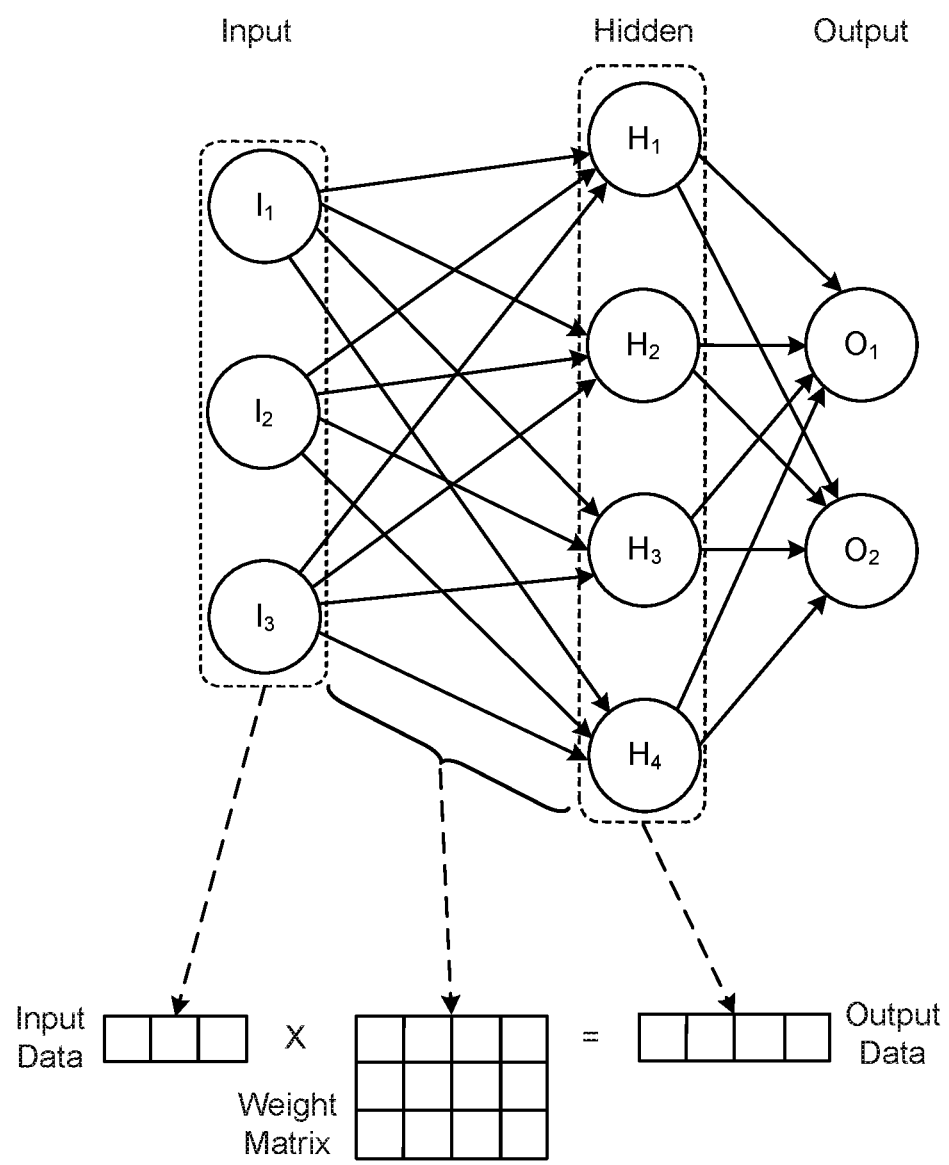
FIG. 8 is a schematic representation of the use of matrix multiplication in a neural network.

In some embodiments, matrix multiplication is performed. Matrix multiplication may include parallel sensing memory cells connected to more than one bit line. In some embodiments, matrix multiplication is used in a neural network. FIG. 8 is a schematic representation of the use of matrix multiplication in a neural network. Matrix multiplication, or MatMul, is a commonly used approach in both the training and inference phases for neural networks and is used in kernel methods for machine learning. FIG. 8 at top is similar to FIG. 6, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 7B, the inference phase loads the neural network weights at step 722 before the matrix multiplications are performed by the propagation at step 723. However, as the amount of data involved can be extremely large, use of a multiplier-accumulator for inferencing has several issues related to loading of weights. One of these is high energy dissipation due to having to use large MAC arrays with the required bit-width. Another is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of Storage Class Memory (SCM), such as those based on ReRAM, PCM, or MRAM based memory cells. This allows for the neural network inputs to be provided via read commands and the neural weights to be preloaded for inference. By use of in-memory computing, this can remove the need for logic to perform the matrix multiplication in the MAC array and the need to move data between the memory and the MAC array.

Figure 9:
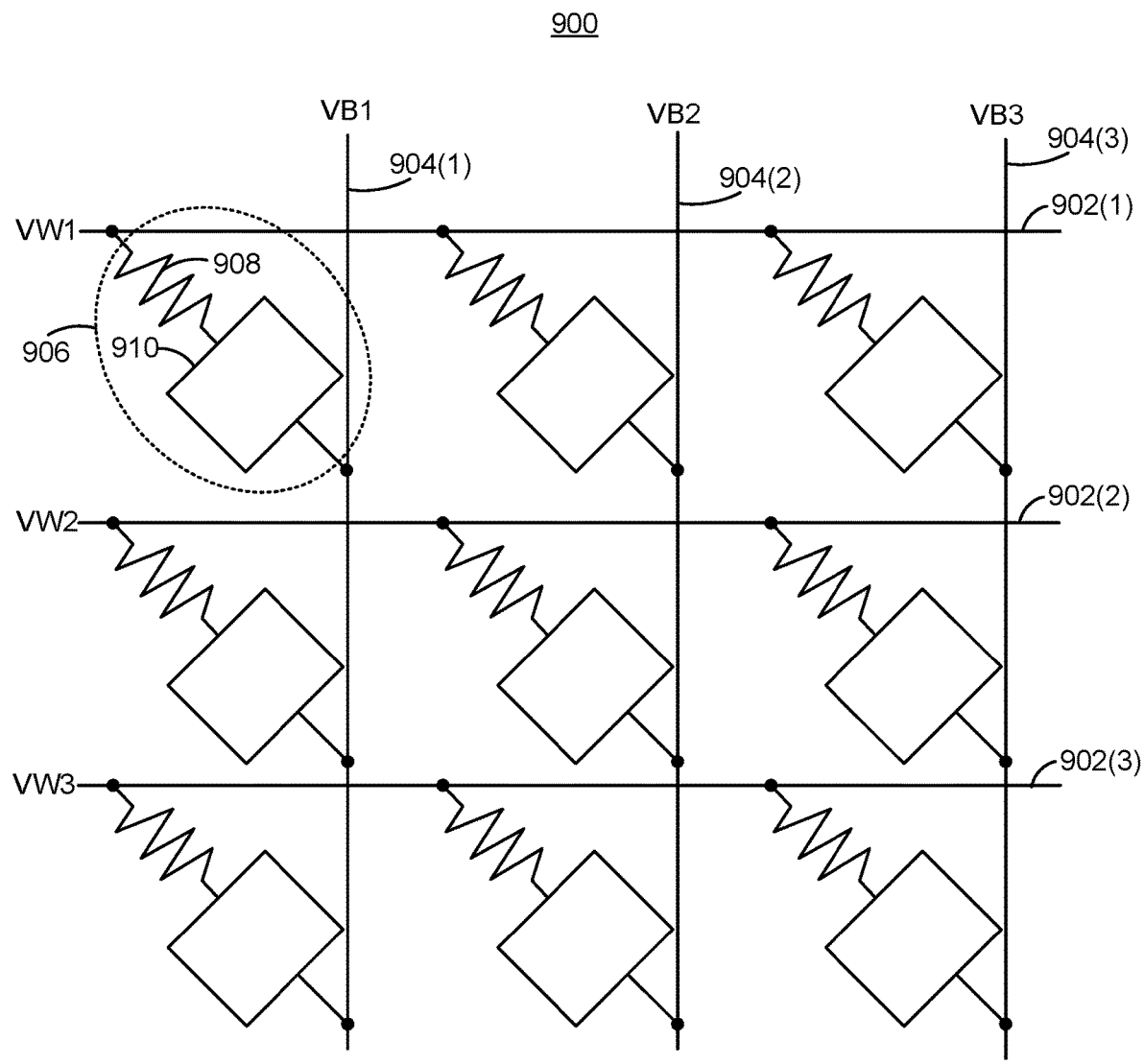
FIG. 9 is a diagram depicting one embodiment of a portion of a cross-point array that may be used for in-memory computing.

FIG. 9 is a diagram depicting one embodiment of a portion of a cross-point array 900. In some embodiments, the cross-point array 900 is used for in-memory computing. The array 900 may also be referred to as a cross-bar array. The array 900 has a number of first conductive lines 902(1)-902(3), and a number of second conductive lines 904(1)-904(3). There are typically many more first conductive lines 902, as well as many more second conductive lines 904. In some embodiments, the first conductive lines 902 are referred to as word lines, with the second conductive lines 904 being referred to as bit lines. In some embodiments, the first conductive lines 902 are referred to as row lines, with the second conductive lines 904 being referred to as horizontal conductive lines. In some embodiments, the first conductive lines 902 are referred to as row lines, with the second conductive lines 904 being referred to as vertical conductive lines.

The cross-point array 900 has a number of memory cells 906. Each memory cell 906 has a reversible resistivity element 908 and a steering element 910. The reversible resistivity element 908 could include, but is not limited to, ReRAM, magneto-resistive memory (e.g., MRAM, Spin Transfer Torque MRAM, Spin Orbit Torque MRAM), and phase change memory (e.g., PCM). Each memory cell 906 is electrically connected to one first conductive line 902 and to one second conductive line 904.

In some embodiments, the steering element 910 has a diode. In some embodiments, the steering element 910 has a switch in parallel with the diode. In one embodiment, the switch comprises a transistor in parallel with the diode. In one embodiment, the transistor is a bipolar junction transistor (BJT). In one embodiment, the transistor is a field effect transistor (FET). In one embodiment, the transistor is a photo-transistor. However, the switch is not required to include a transistor. In one embodiment, the switch includes a magneto-resistor. The magneto-resistor can be operated as a switch by placing the magneto-resistor in either a very high resistance state or a very low resistance state. Furthermore, the steering element 910 is not required to have a switch in parallel with the diode. In one embedment, the steering element 910 has a photo-diode in series with the reversible resistivity element 908. However, the steering element 910 does not contain a switch in parallel with the photo-diode. Further details of various embodiments of the steering element 910 are discussed below.

The memory structure control circuits 504 are configured to control operation of the cross-point array 900. In some embodiments, the memory structure control circuits 504 are configured to operate the steering elements 910 in a sensing mode and in a bipolar programming mode. The sensing mode is used to sense (e.g., read) one or more selected memory cells 906. The programming mode is used to program one or more selected memory cells 906. In one embodiment, the memory structure control circuits 504 operate the steering elements 910 during the sensing mode such that sense currents pass through the diodes and any sneak currents are blocked by the diodes.

However, the presence of the diode in a steering element could potentially interfere with bipolar programming of the memory cells 906. Briefly, bipolar programming includes applying a first voltage having one polarity to a selected memory cell to increase its resistance, and applying a second voltage having the opposite polarity to a selected memory cell to decrease its resistance. In one embodiment, the memory structure control circuits 504 operates the steering element 910 of a selected memory cell such that, when programming using the first voltage, a current passes in one direction through the steering element 910 to the reversible resistivity element 908 of the selected memory cell. However, when programming using the second voltage a current passes in the opposite direction from the steering element 910 to the reversible resistivity element 908 of the selected memory cell.

In some embodiments, the switch that is in parallel with the diode in the steering element 910 is closed while programming the selected memory cell in order to provide a current path that bypasses the diode in the steering element. In some embodiments, the switch includes a transistor, wherein the switch is closed by applying a control voltage to a control terminal of a transistor in order to place the transistor into a conductive state, which allows for bipolar programming. In some embodiments, the switch includes a photo-transistor, wherein the switch is closed by applying light to the transistor to place the transistor into a conductive state, which allows for bipolar programming. In some embodiments, the switch includes a magneto-resistance element, wherein the switch is closed by applying a magnetic field to the magneto-resistance element to place the magneto-resistance element into a conductive state, which allows for bipolar programming.

As noted above, the steering element 910 is not required to have a switch in parallel with the diode. In one embodiment, the diode in the steering element 910 is a photo-diode. In one embodiment, the memory structure control circuits 504 control a light source to provide light to the photo-diode to make the photo-diode conductive when programming the selected memory cell, which allows for bipolar programming.

In some embodiments, the cross-point array 900 may be used to perform in-memory computing. In one embodiment, multiplication is performed. In one embodiment, vector/vector multiply is performed. In one embodiment, vector/matrix multiply is performed. In one embodiment, the in-memory computing is performed based on currents caused by the respective memory cells 906 in response to the voltages applied to the word lines 902, as well as voltages applied to the bit lines 904. In some embodiments, the current that flows in a bit line 904 is sensed to determine the result.

An example of vector/vector multiplication will be discussed. The magnitude of the voltage applied to each word line 902 may be used to represent one element of an input vector (such as the input data in FIG. 8). Each memory cell 906 may be programmed to a state that represents an element in a second vector. In one embodiment, each memory cell 906 is programmed with one bit of information. For example, the memory cell 906 could be programmed to either a high resistance state or a low resistance state. In this example, each element in the second vector has a resolution of one-bit. However, the elements in the second vector could have a greater resolution. The current that flows in each bit line 904 represents multiplication of one element of the input vector and one element of the second vector. Another way to state this principle is that the current that flows in each bit line 904 represents a multiply and accumulate (MAC). Here, the multiply refers to applying a voltage to an individual memory cell, and accumulate refers to accumulating the sensing currents for all memory cells in a column.

A vector/matrix multiply can be performed by, in effect, performing a number of vector/vector multiplies in parallel. To do so, memory cells in multiple columns are sensed in parallel. Sensing memory cells in multiple columns in parallel is referred to herein as parallel reading of memory cells. Embodiments disclosed herein are well-suited for such parallel reads of memory cells. The foregoing example of vector/matrix multiply is just one example that may employ a parallel read of memory cells in a cross-point array.

Figure 10:
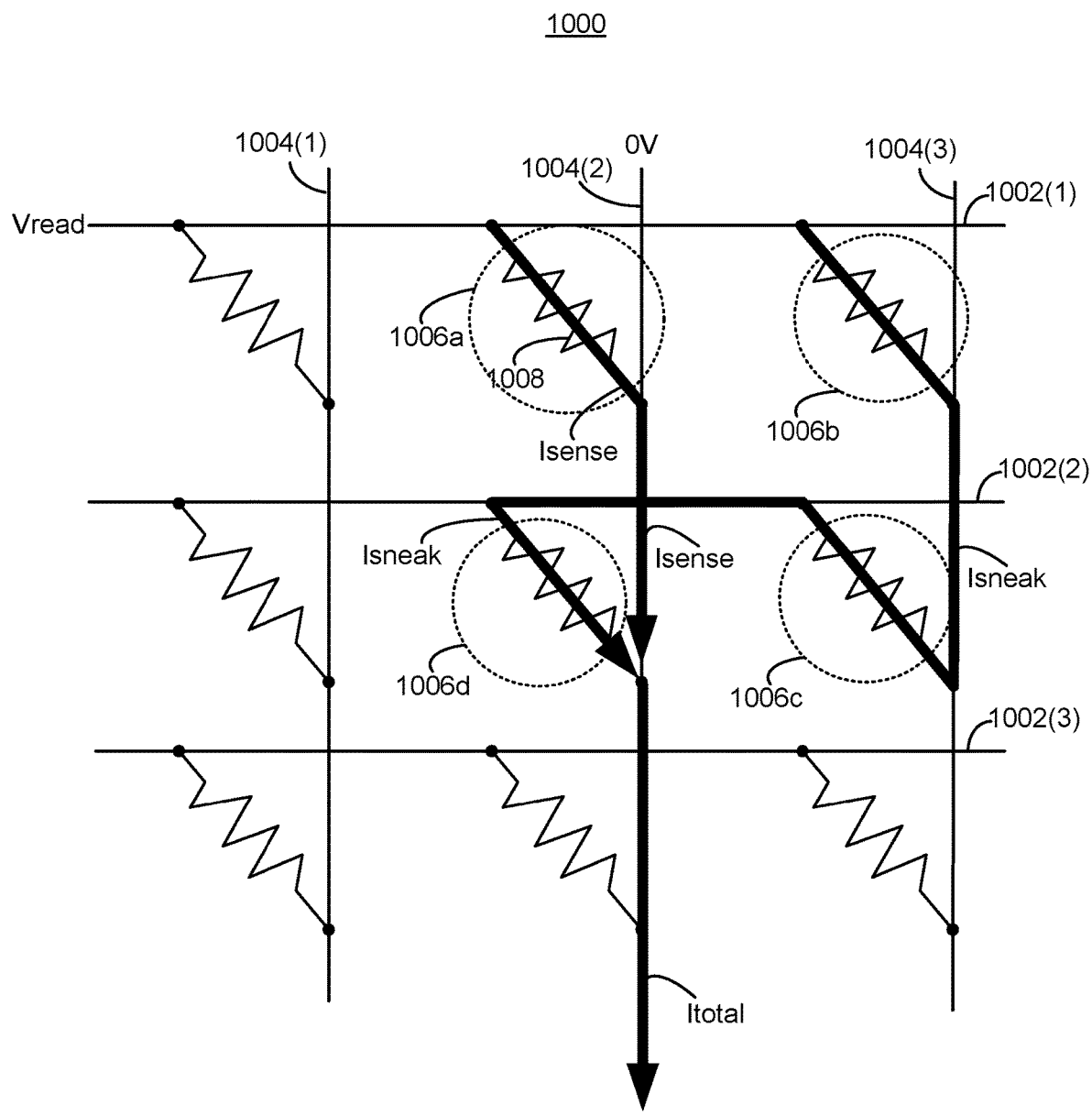
FIG. 10 depicts an example cross-point array to illustrate sneak currents.

As noted above, the steering elements 910 may be controlled in a sensing mode to pass sense currents and to block sneak currents. FIG. 10 depicts an example cross-point array 1000 to illustrate sneak currents. The array 1000 has a number of word lines 1002(1)-1002(3), and a number of bit lines 1004(1)-1004(3). The cross-point array 1000 has a number of memory cells 1006 electrically connected to one word line 1002 and to one bit line 1004. Each memory cell 1006 has a reversible resistivity element 1008.

A selected memory cell 1006a is being sensed by applying a read voltage Vread to word line 1002(1) and 0V to bit line 1004(2), which results in a sense current (Isense) in bit line 1004(2). A sense current is defined herein as a current that flows through a read selected memory cell to or from the selected bit line to which the read selected memory cell is connected, wherein the selected bit line is the bit line that is sensed in order to sense a condition of the read selected memory cell. Note that although the sense current is depicted as flowing from the read selected memory cell to bit line in FIG. 10, a sense current could flow from the bit line to the read selected memory cell.

Undesirably, a sneak current (Isneak) may be also passed to the selected bit line 1004(2). The sneak current flows through memory cell 1006b, bit line 1004(3), memory cell 1006c, word line 1002(2), memory cell 1006d, and into selected bit line 1004(2). Note that the sneak current flows in the opposite direction in memory cell 1006c than the sense current flows in selected memory cell 1006a. A sneak current is defined herein as a current that flows in a reverse direction through a memory cell that is not to be sensed by the selected bit line and reaches the selected bit line, wherein reverse direction is relative to the direction the current flows through the selected memory cell connected to the selected bit line. Note that memory cell 1006c, if selected, is to be sensed by bit line 1004(3) and not by selected bit line 1004(2).

The combination of the sense current and the sneak current results in a total current referred to as Itotal. The total current will be sensed by the sensing circuit. For example, a sense amplifier connected to bit line 1004(2) will sense Itotal. Hence, the sneak current (Isneak) will result in an inaccurate measurement of the sense current from memory cell 1006a. Note that the problem of the sneak current could be especially severe if memory cell 1006a is in a high resistance (and hence low current) state, with one or more of memory cells 1006b, 1006c, 1006c in a low resistance (and high current) state.

Embodiments of steering elements 910 disclosed herein are able to pass sense currents to selected bit lines, while blocking sneak currents from reaching selected bit lines. Moreover, bipolar programming of memory cells is possible. Moreover, parallel read of memory cells is possible. In other words, there may be multiple selected bit lines during read.

Figure 11:
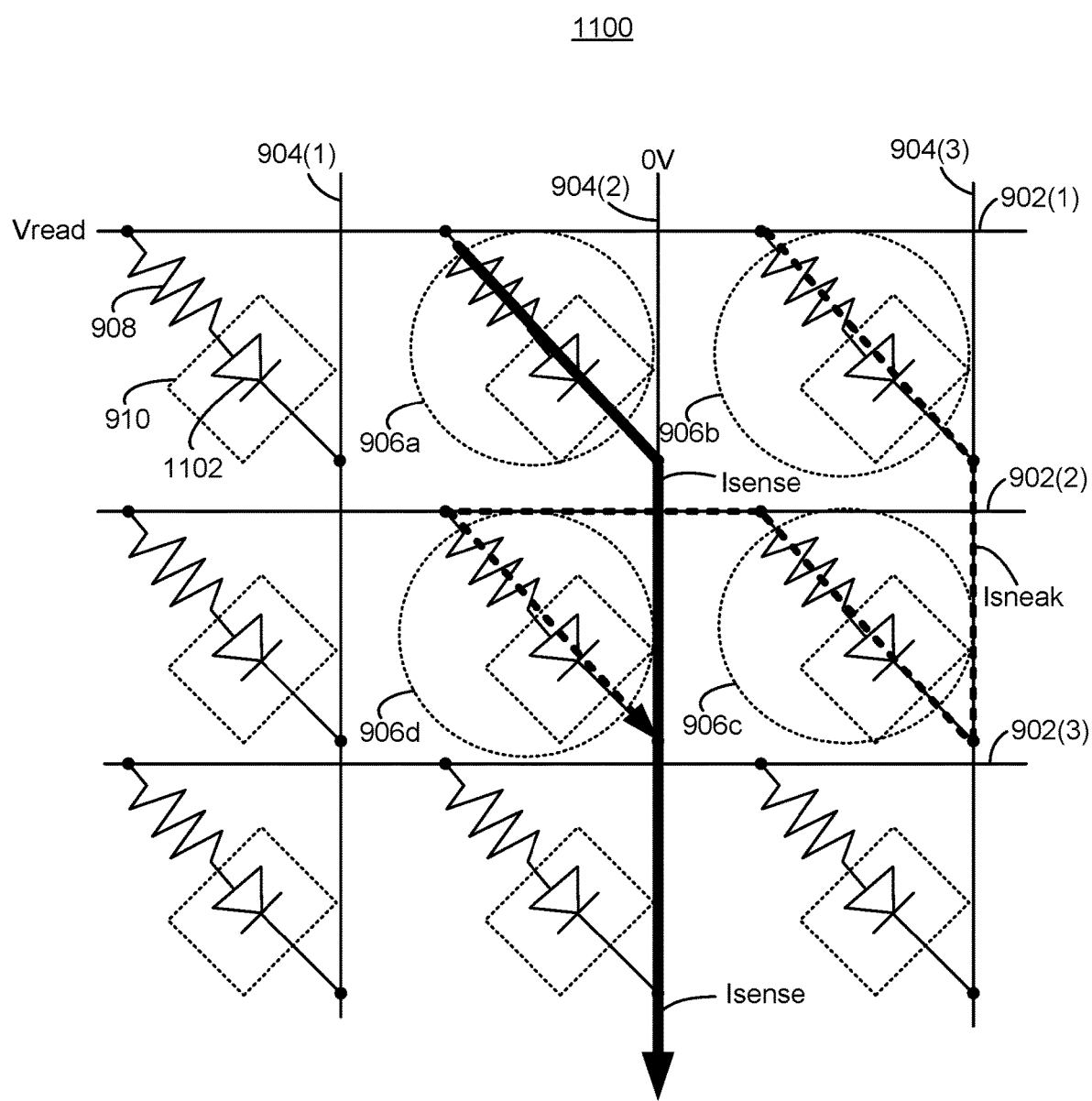
FIG. 11 depicts one embodiment of a cross-point array to illustrate operation during embodiments of a read mode.

FIG. 11 depicts one embodiment of a cross-point array 1100 to illustrate operation during embodiments of a read mode. During the read mode, the steering element 910 may be used to pass sense currents to selected bit lines, while blocking sneak currents from reaching selected bit lines. The array 1100 has a number of word lines 902(1)-902(3), and a number of bit lines 904(1)-904(3). The cross-point array 1100 has a number of memory cells 906, each electrically connected to one word line 902 and to one bit line 904. Each memory cell 906 has a reversible resistivity element 908 and a steering element 910. The steering element 910 has a diode 1102. The diode 1102 allows current to pass in one direction, while blocking current in the opposite direction. In one embodiment, the diode 1102 allows current to flow from its anode to its cathode, but blocks current flow from its cathode to its anode.

The diode is electrically in series with the reversible resistivity element 908. By electrically in series is it meant that any current that flows through the reversible resistivity element 908 will flow through the steering element 910. The term "series connected" may also be used to refer to the diode being electrically in series with the reversible resistivity element 908. That is, it may be stated that the diode 1102 is series connected with the reversible resistivity element 908. Note that there may be one or more circuit elements connected between the diode 1102 and the series connected reversible resistivity element 908. The cross-point array 1100 is one embodiment of the cross-point array 900 in FIG. 9.

A selected memory cell 906a is being sensed by applying a read voltage Vread to word line 902(1) and 0V to bit line 904(2), which results in a sense current (Isense) in bit line 904(2). Herein, the terms "selected word line" and "selected bit line" are used to refer to the word line and bit line that are connected to a selected memory cell. A sense current is defined herein as a current that flows through a selected memory cell to or from the selected bit line to which the selected memory cell is connected, wherein the selected bit line is the bit line that is sensed in order to sense a physical state (e.g., resistance) of the memory cell. Note that although the sense current is depicted as flowing from the selected memory cell to selected bit line in FIG. 11, a sense current could flow from the selected bit line to the selected memory cell.

A potential sneak current is represented by a dashed arrow that passes through memory cell 906b, bit line 904(3), memory cell 906c, word line 902(2), and memory cell 906d. Note that the potential sneak current flows in the opposite direction in memory cell 906c than the sense current flows in selected memory cell 906a. Thus, the diode 1102 in the steering element 910 of memory cell 906c blocks the potential sneak current. Stated another way, the diodes 1102 do not permit current to flow from cathode-to-anode under normal operating conditions. A diode may, under some conditions, allow current to flow from the cathode-to-anode, such as under reverse bias breakdown. However, under normal sensing conditions, the diodes 1102 will not incur reverse bias breakdown. In other words, under normal sensing conditions, the diodes 1102 are not reverse biased to the extent that reverse bias breakdown will occur. Moreover, in some embodiments, the diodes 1102 are not reverse biased at all during sensing. In some embodiments, even if some diodes 1102 are reverse biased to a small extent during sensing, the very small amount of sneak current that may possibly pass through a reverse biased diode will not lead to inaccurate sensing. Hence, in some embodiments, the potential sneak current does not reach the selected bit line 904(2). In some embodiments, even if a very small amount of sneak current does reach the selected bit line 904(2), sensing of the selected memory cell is not impacted. Note that herein, the phrase "blocking a sneak current" or the like allows for some small amount of sneak current to reach the selected bit line, provided that this does not lead to the physical state of any selected memory cell being mis-read.

Figure 12A:
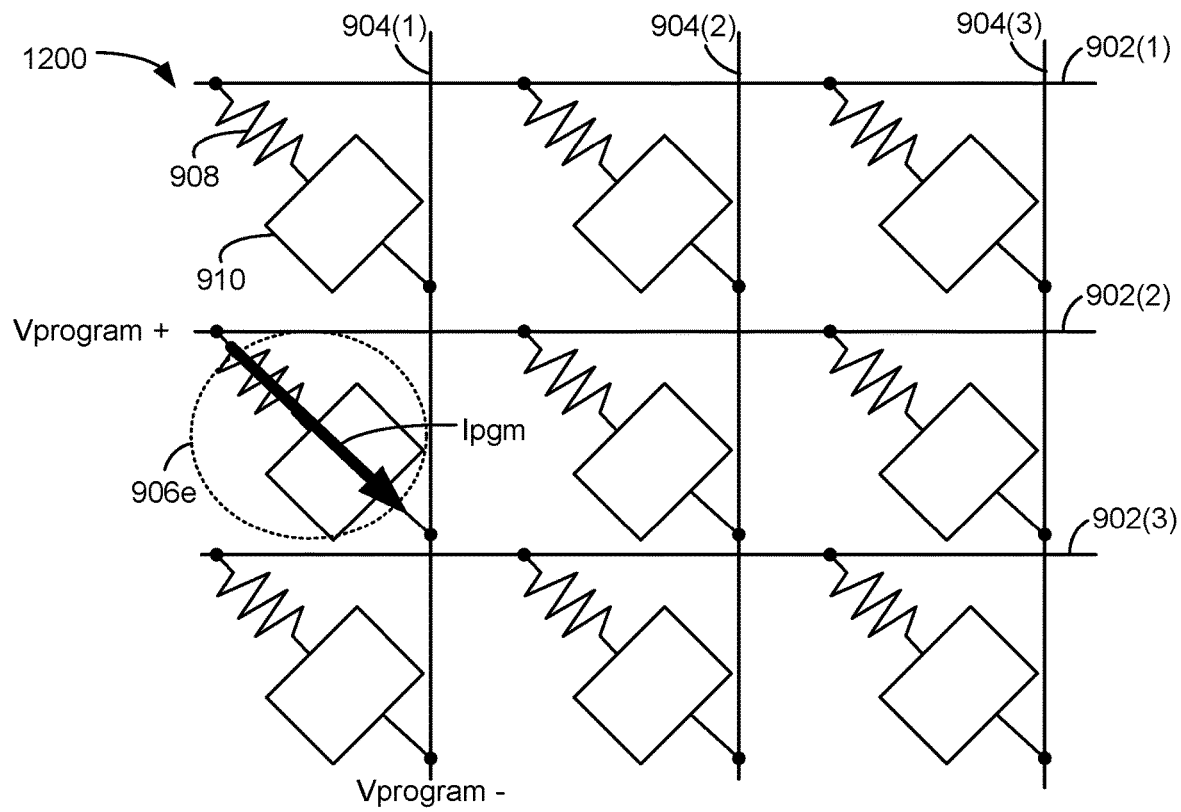
FIGS. 12A and 12B depict one embodiment of a cross-point array to illustrate operation during embodiments of a bipolar programming mode.
Figure 12B:
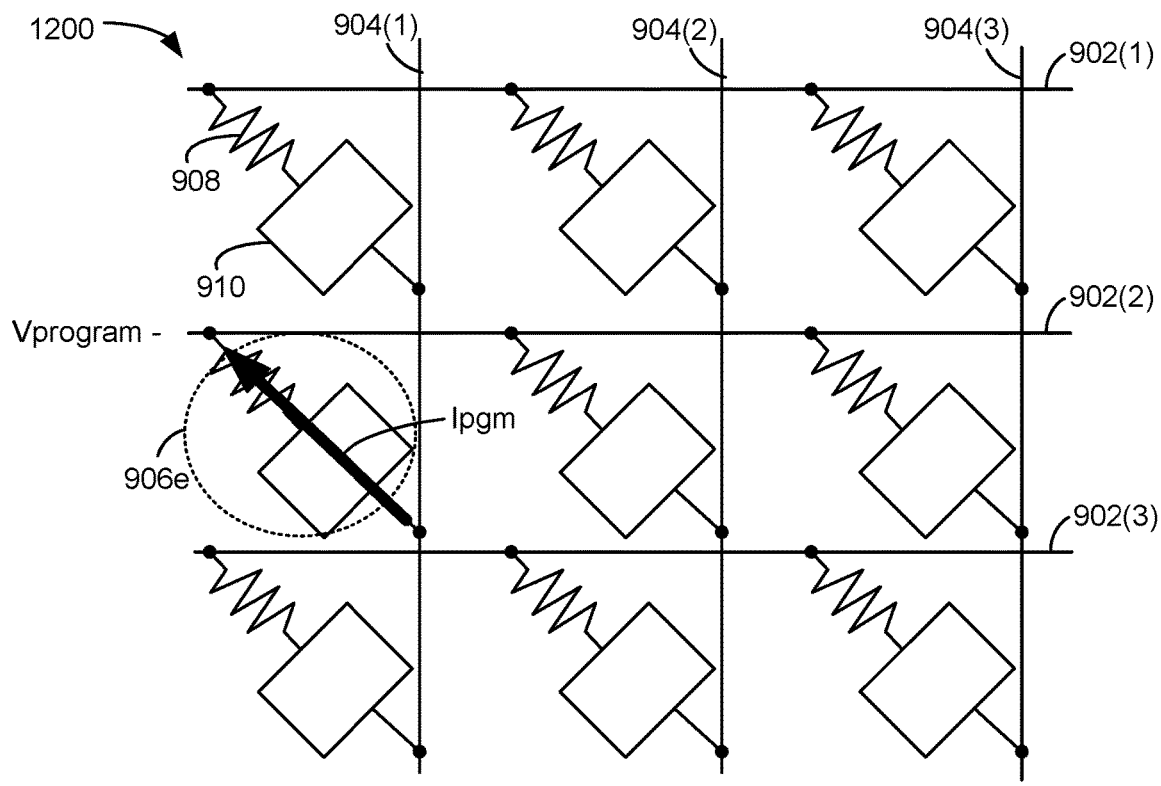

As noted above, in some embodiments, the steering element 910 is operated in a mode that allows bipolar programming of the memory cells. FIGS. 12A and 12B are diagrams of a cross-point array 1200, showing bipolar programming of a selected memory cell. The array 1200 has a number of word lines 902(1)-902(3), and a number of bit lines 904(1)-904(3). The cross-point array 1200 has a number of memory cells 906, each electrically connected to one word line 902 and to one bit line 904. Each memory cell 906 has a reversible resistivity element 908 and a steering element 910.

In one embodiment of bipolar programming, a voltage having one polarity is used to increase the resistance of the reversible resistivity element 908 to a stable high resistance state, and a voltage having the opposite polarity is used to decrease the resistance of the reversible resistivity element 908 to a stable low resistance state. Placing the reversible resistivity element 908 in the stable low-resistance state is sometimes referred to as SETTING the memory cell. Placing the reversible resistivity element 908 in the stable high-resistance state is sometimes referred to as RESETTING the memory cell.

In FIGS. 12A and 12B, memory cell 906e is selected for programming. More than one memory cell could be selected for programming. In FIG. 12A, Vprogram+ is applied to word line 902(2) while Vprogram− is applied to bit line 904(1). Vprogram+ has a larger magnitude than Vprogram−. For example, Vprogram+ could be larger than 0V, whereas Vprogram− could be 0V or less than 0V. The steering element 910 of memory cell 906e is operated such that a current Ipgm is allowed to flow from the reversible resistivity element 908 through the steering element 910 to the bit line 904(1).

In FIG. 12B, Vprogram− is applied to word line 902(2) while Vprogram+ is applied to bit line 904(1). As in the example of FIG. 12A, Vprogram+ has a larger magnitude than Vprogram−. However, Vprogram+ could have a different magnitude in FIG. 12B than in FIG. 12A. Also, Vprogram− could have a different magnitude in FIG. 12B than in FIG. 12A. The steering element 910 of memory cell 906e is operated such that a current Ipgm is allowed to flow from the bit line 904(1) through the steering element 910, and to the reversible resistivity element 908.

Note that although the diode 1102 is not depicted in steering element 910 in FIGS. 12A and 12B, the diode 1102 is still present in the steering element 910. Recall that in the read mode the diode 1102 in the steering element 910 blocks sneak currents (see FIG. 11). However, the diode 1102 in the steering element 910 does not block Ipgm during bipolar programming, regardless of the direction in which Ipgm flows through the steering element 910. Hence, the steering element 910 may be controlled to provide both a read mode in which sneak currents are blocked, as well as a bipolar programming mode.

Figure 13:
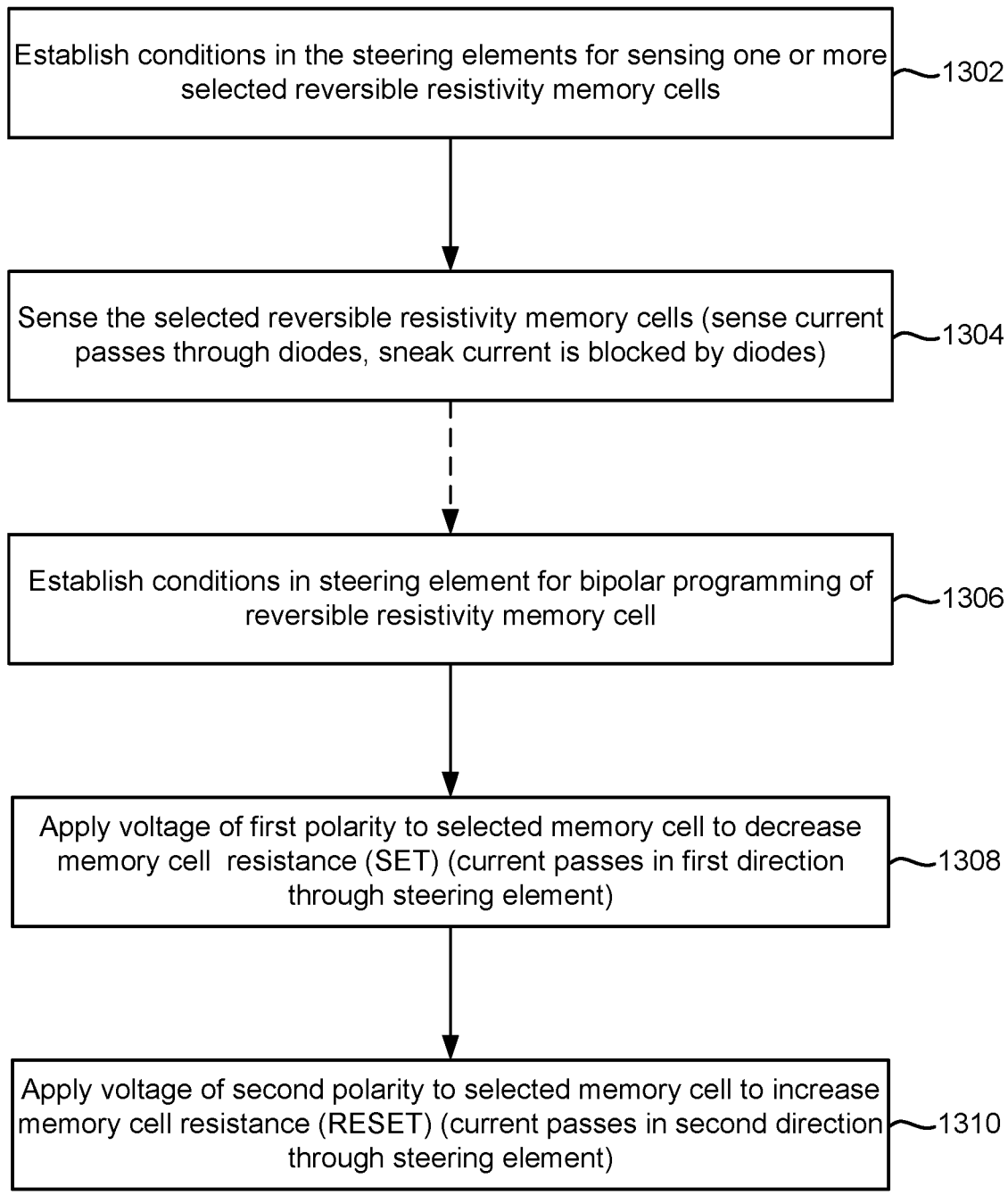
FIG. 13 is a flowchart of one embodiment of a process of operating non-volatile storage.

As noted above, in some embodiments, the steering element 910 is operated in a sensing mode and a bipolar programming mode. FIG. 13 is a flowchart of one embodiment of a process 1300 of operating non-volatile storage. In process 1300, the steering element 910 is operating in a sensing mode and a bipolar programming mode. In one embodiment, process 1300 is performed by memory structure control circuits 504. In one embodiment, memory structure control circuits 504 reside on memory die 292 with the memory structure 506. In one embodiment, memory structure control circuits 504 reside on control die 592, with the memory structure 506 residing on memory structure die 590.

Step 1302 includes establishing conditions in the steering elements 910 for sensing one or more reversible resistivity memory cells 906. In one embodiment, the same conditions are established in the steering elements 910 of both selected and unselected memory cells 906. In one embodiment, step 1302 includes configuring the steering elements 910 such that, for each memory cell 906, the diode 1102 is placed in a series connection with the reversible resistivity element 908. FIG. 11 depicts an example of, for each memory cell 906, the diode 1102 placed in a series connection with the reversible resistivity element 908 of that memory cell.

Step 1304 includes sensing the selected memory cells 906. In step 1304, for each selected memory cell, any sense current will pass through the diode 1102 in the steering element 910 of that selected memory cell. For example, the sense current will pass from anode to cathode. However, sneak currents will be blocked by diodes 1102. For example, the sneak currents are not permitted to flow from cathode to anode in the diodes 1102. FIG. 11 depicts one example of the diode 1102 of a selected memory cell 906a passing the sense current (Isense) to bit line 904(2). FIG. 11 also depicts a sneak current (Isneak) being blocked by the diode in memory cell 906c.

Note that in some embodiments, more than one memory cell 906 in a column may be sensed at the same time. Such a sensing operation may be used to performed a multiply and accumulate. Note that in some embodiments, step 1304 includes sensing memory cells 906 in more than one column. In other words, more than one bit line 904 can be selected at the same time.

There is a dashed arrow between step 1304 and 1306 to indicate that some time may pass between these steps. Step 1306 includes establishing conditions in the steering elements 910 for bipolar programming of one or more reversible resistivity memory cells 906. In one embodiment, the same conditions are established in the steering elements 910 of both selected and unselected memory cells 906. However, in another embodiment, the conditions are established in the steering elements 910 of selected memory cells; however, the conditions are not required to be established in the steering elements 910 of unselected memory cells.

In one embodiment, step 1306 includes configuring the steering elements 910 such that, for each selected memory cell 906, a current could flow in either direction through the steering element 910. FIG. 12A illustrates an example in which a current flows through the steering element 910 in memory cell 906e in a first direction. FIG. 12B illustrates an example in which a current flows through the steering element 910 in memory cell 906e in a second direction, which is opposite the first direction.

Step 1308 includes applying a voltage having a first polarity to a selected memory cell to decrease the memory cell resistance. In one embodiment, step 1308 SETs the memory cell. In step 1308, current flows through the steering element 910 in a first direction. The current may also flow through the reversible resistivity element 908. With reference to FIG. 12A, Vprogram+ is applied to word line 902(2) while Vprogram− is applied to bit line 904(1), which results in current (Ipgm) flowing through the steering element 910 in memory cell 906e to the bit line 904(1). The current may also flow through the reversible resistivity element 908 in memory cell 906e.

Step 1310 includes applying a voltage having a second polarity to the selected memory cell to increase the memory cell resistance. In one embodiment, step 1310 RESETs the memory cell. In step 1310, current flows through the steering element 910 in a second direction, which is opposite the first direction. The current may also flow through the reversible resistivity element 908. With reference to FIG. 12B, Vprogram− is applied to word line 902(2) while Vprogram+ is applied to bit line 904(1), which results in current (Ipgm) flowing from the bit line 904(1) through the steering element 910 in memory cell 906e. The current may also flow through the reversible resistivity element 908 in memory cell 906e.

Thus, in process 1300 the steering elements 910 are controlled in a sensing mode in which the diodes 1102 in the steering elements 910 allow sense currents to pass while blocking sneak currents. However, the diodes 1102 in the steering elements 910 do not interfere with bipolar programming of the memory cells 906 due to the conditions that are established at least in the selected memory cells 906 during bipolar programming.

As noted above, in some embodiments, the steering element 910 has a switch in parallel with the diode. FIG. 14 depicts one embodiment of a cross-point array 1400 in which the steering element 910 of a memory cell 906 has a switch in parallel with a diode. The cross-point array 1400 may be controlled by memory structure control circuits 504. The array 1400 has a number of word lines 902(1)-902(3), and a number of bit lines 904(1)-904(3). The cross-point array 1400 has a number of memory cells 906, each electrically connected to one word line 902 and to one bit line 904. Each memory cell 906 has a reversible resistivity element 908 and a steering element 910.

The steering element 910 has a diode 1102 in parallel with a switch 1402. In FIG. 14, the switch 1402 has a first terminal 1404a connected to the reversible resistivity element 908, and a second terminal 1404b connected to the bit line 904(1). In another embodiment, the positions of the steering element 910 and the reversible resistivity element 908 may be reversed, such that the switch 1402, as well as the diode 1102, are connected to a word line 902 and the reversible resistivity element 908 is connected to a bit line 904.

The switch 1402 may also be referred to as an electrical switch. The switch 1402 is an electrical component that when in a first state (e.g., closed or conducting) provides a conducting path between the reversible resistivity element 908 and a bit line 904 or word line 902, and when in a second state (e.g., open or non-conducting) removes that conducting path between the reversible resistivity element 908 and the bit line 904 or word line 902. For example, with reference to FIG. 14, when in the first state the switch 1402 provides a conducting path for current to flow between the reversible resistivity element 908 and the bit line 904. When in the second state, the switch 1402 removes that conducting path between the reversible resistivity element 908 and the bit line 904. As noted, the physical positions of the reversible resistivity element 908 and the steering element may be reversed such that the when in the first state the switch 1402 provides a conducting path for current to flow between the reversible resistivity element 908 and the word line 902.

FIG. 15A depicts one embodiment of a memory cell 906 that may be used in the cross-bar array 1400 of FIG. 14. In the embodiment of FIG. 15A, the switch 1402 is implemented with a field effect transistor (FET) 1502a. The FET 1502a has a control terminal 1504a to which a control voltage (Vgate) is applied. In this example, the control terminal 1504a is the gate of the FET 1502a. The control voltage (along with suitable voltages applied to the word line 902 and the bit line 904) determines whether the FET 1502a is conducting or non-conducting. Hence, the FET 1502a may be operated as a switch 1402. As one example, during a sensing operation, Vgate is 0V, the word line voltage is 0.2V, and the bit line voltage is GND. However, other voltages may be used. As one example, for a first polarity of a bipolar programming operation, Vgate is 1.0V (e.g., a range 0.6V to 1.7V), the word line voltage is 0V, and the bit line voltage is 1.6V. As one example, for a second polarity of a bipolar programming operation, Vgate is 1.0V (e.g., range 0.6V to 1.7V), the word line voltage is 1.6V, and the bit line voltage is 0V. However, other voltages and voltage ranges may be used.

FIG. 15B depicts one embodiment of a memory cell 906 that may be used in the cross-bar array 1400 of FIG. 14. In the embodiment of FIG. 15B, the switch 1402 is implemented with a bipolar junction transistor (BJT) 1502b. The BJT 1502b has a control terminal 1504b to which a control voltage (Vbase) is applied. In this example, the control terminal 1504b is the base of the BJT 1502b. The control voltage (along with suitable voltages applied to the word line 902 and the bit line 904) determines whether the BJT 1502b is conducting or non-conducting. Hence, the BJT 1502b may be operated as a switch 1402. As one example, during a sensing operation, Vbase is 0V, the word line voltage is 0.2V, and the bit line voltage is GND. However, other voltages may be used. As one example, for a first polarity of a bipolar programming operation, Vbase is 1.0V (e.g., a range 0.6V to 1.7V), the word line voltage is 0V, and the bit line voltage is 1.6V. As one example, for a second polarity of a bipolar programming operation, Vbase is 1.0V (e.g., range 0.6V to 1.7V), the word line voltage is 1.6V, and the bit line voltage is 0V. However, other voltages and voltage ranges may be used.

Figure 16:
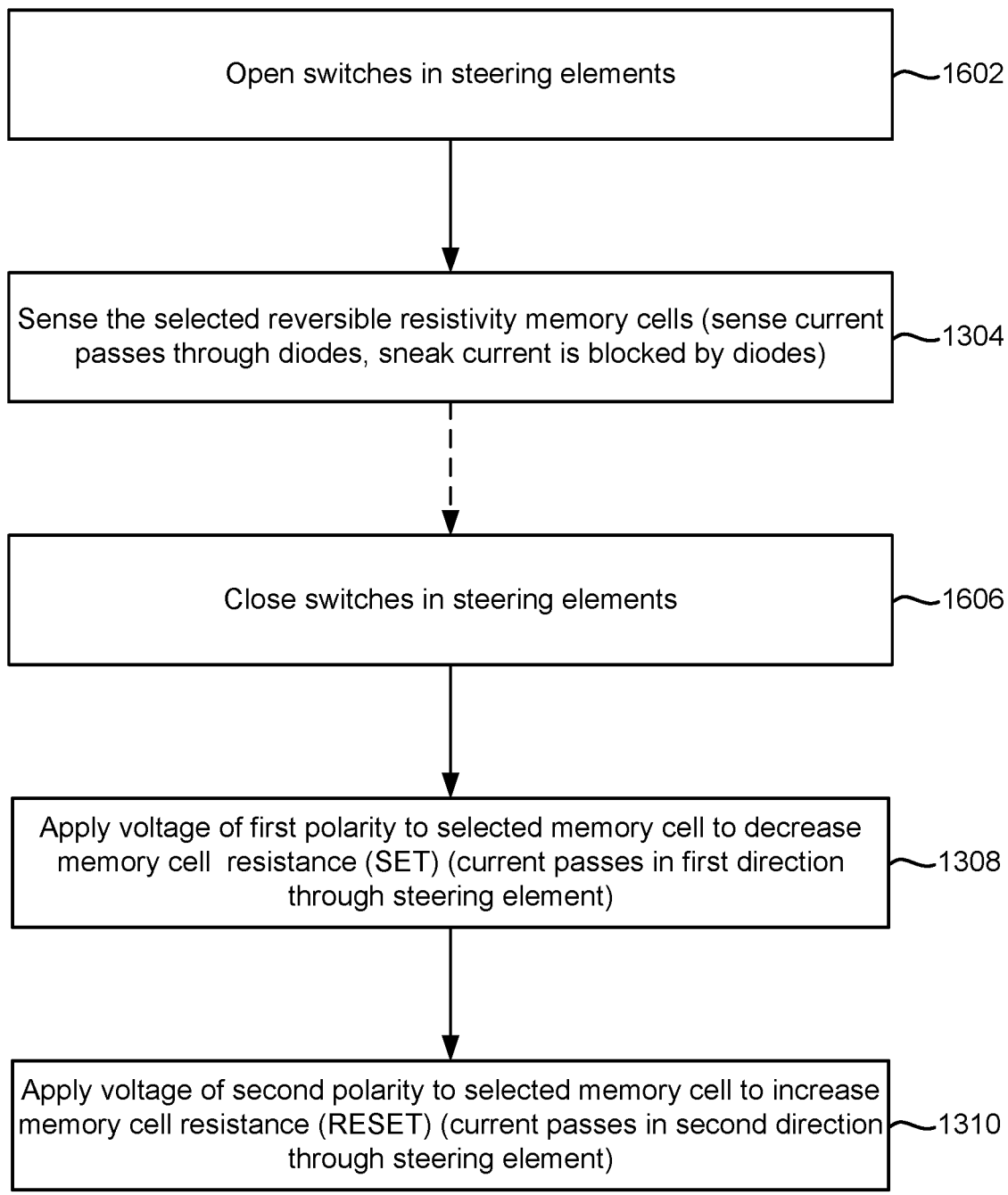
FIG. 16 is a flowchart of one embodiment of a process of operating steering elements in a cross-point array.

FIG. 16 is a flowchart of one embodiment of a process 1600 of operating steering elements 910 in a cross-point array. Process 1600 may be used with array 1400, but it not limited thereto. The process 1600 provides further details for one embodiment of process 1300. In one embodiment, process 1600 is performed by memory structure control circuits 504. In one embodiment, memory structure control circuits 504 reside on memory die 292 with the memory structure 506. In one embodiment, memory structure control circuits 504 reside on control die 592, with the memory structure 506 residing on memory structure die 590. In FIG. 16, reference numerals 1304, 1308, and 1310 (which were used in FIG. 13) are used again to indicate that these steps may be similar to process 1300.

Step 1602 includes opening switches 1402 in steering elements 910. Step 1602 is one embodiment of step 1302 (establishing conditions in the steering elements 910 for sensing one or more reversible resistivity memory cells 906). In one embodiment, the switches 1402 are opened in the steering elements 910 of both selected and unselected memory cells 906. In one embodiment, opening the switch 1402 of a given memory cell 906 places the diode 1102 in a series connection with the reversible resistivity element 908. For example, with reference to FIG. 14, when the switch 1402 of a given memory cell 906 is open, the diode 1102 of that memory cell is placed in a series connection with the reversible resistivity element 908 of that memory cell.

Step 1304 includes sensing the selected memory cells 906. In step 1304, for each selected memory cell, any sense current will pass through the diode 1102 in the steering element 910 of that selected memory cell. However, sneak currents will be blocked by diodes 1102.

Step 1606 includes closing the switches 1402 in steering elements 910. Step 1606 is one embodiment of step 1306 (establishing conditions in the steering elements 910 for bipolar programming of one or more reversible resistivity memory cells 906). In one embodiment, the switches 1402 are closed in the steering elements 910 of both selected and unselected memory cells 906. However, in another embodiment, the switches 1402 are closed in the steering elements 910 of selected memory cells 906; however, the switches are not required to be closed in the steering elements 910 of unselected memory cells 906. In one embodiment, closing the switches 1402 allows a current to flow in either direction through the steering element 910. Stated another way, closing the switches 1402 provides a conduction path that bypasses the diode 1102.

Step 1308 includes applying a voltage having a first polarity to a selected memory cell to decrease the memory cell resistance. In one embodiment, step 1308 SETs the memory cell. In one embodiment step 1308, current flows through the switch 1402 in a first direction. The current may also flow through the reversible resistivity element 908. Step 1310 includes applying a voltage having a second polarity to the selected memory cell to increase the memory cell resistance. In one embodiment, step 1310 RESETs the memory cell. In one embodiment of step 1310, current flows through the switch 1402 in a second direction, which is opposite the first direction.

Figure 17:
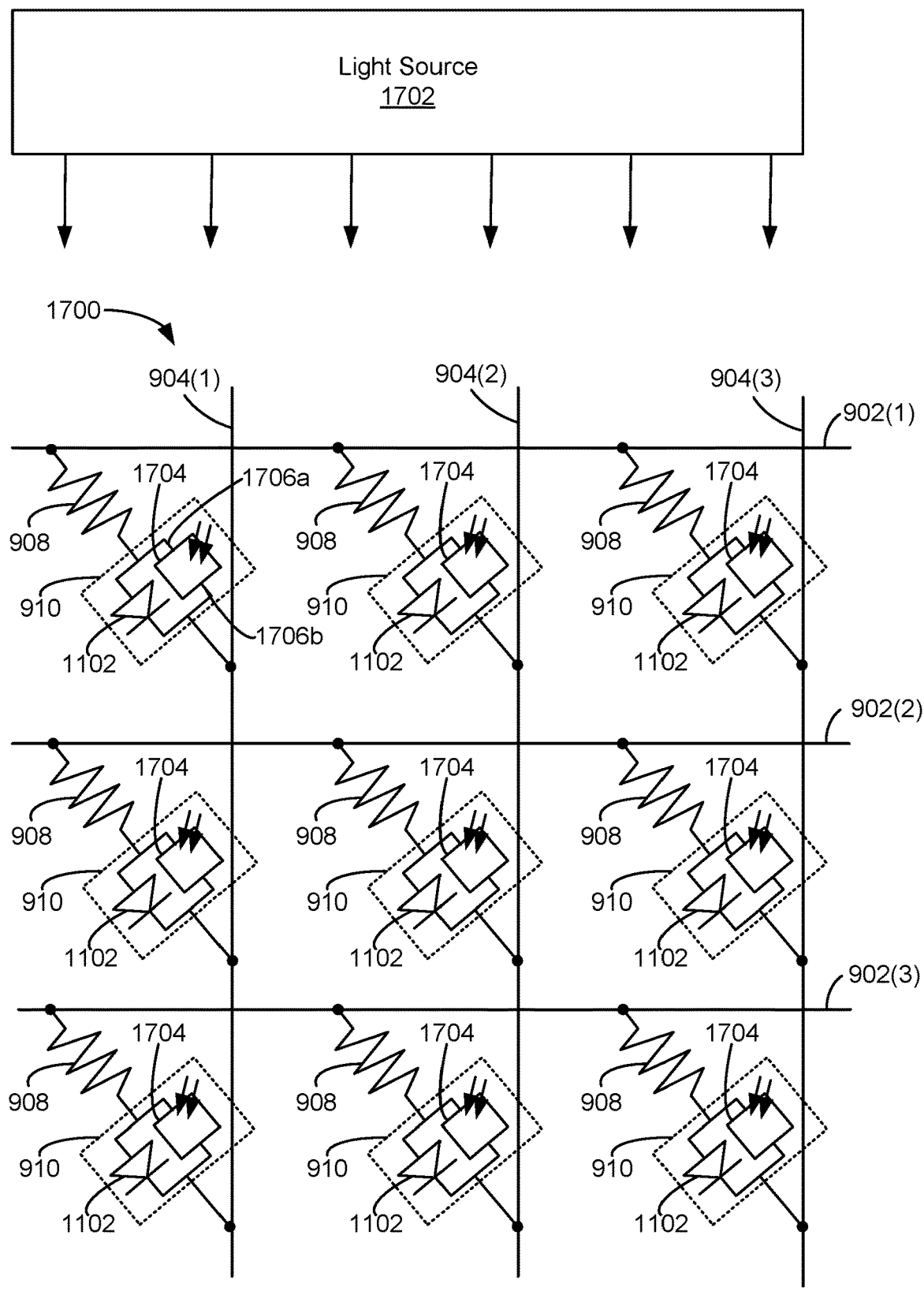
FIG. 17 depicts one embodiment of a cross-point array having a photo-switch that is controllable by a light source.

In some embodiments, the switch in the steering element comprises a photo-switch. A photo-switch, as the term is defined herein, is an electrical component that switches in response to light. FIG. 17 depicts one embodiment of a cross-point array 1700 having a photo-switch that is controllable by a light source. The steering element 910 of each memory cell 906 has a photo-switch 1704 in parallel with a diode 1102. The light source 1702 is configured to output light at a wavelength that controls the photo-switch 1704. In some embodiments, the light source 1702 uniformly illuminates the memory cells in at least one level of the cross-point array.

In one embodiment, the photo-switch 1704 is placed into a conductive state by application of light of a suitable wavelength (or range of wavelengths). In one embodiment, the photo-switch 1704 is placed into a non-conductive state when light of a suitable wavelength (or range of wavelengths) is not provided to the photo-switch 1704. The light source 1702, as well as the cross-point array 1700 may be controlled by memory structure control circuits 504.

In FIG. 17, the photo-switch 1704 has a first terminal 1706a connected to the reversible resistivity element 908, and a second terminal 1706b connected to the bit line 904(1). In another embodiment, the positions of the steering element 910 and the reversible resistivity element 908 may be reversed, such that the photo-switch 1704, as well as the diode 1102, are connected to a word line 902 and the reversible resistivity element 908 is connected to a bit line 904.

The photo-switch 1704 is an electrical component that when in a first state (e.g., closed or conducting) provides a conducting path between the reversible resistivity element 908 and a bit line 904 or word line 902, and when in a second state (e.g., open or non-conducting) removes that conducting path between the reversible resistivity element 908 and the bit line 904 or word line 902. For example, with reference to FIG. 17, when in the first state the photo-switch 1704 provides a conducting path for current to flow between the reversible resistivity element 908 and the bit line 904. When in the second state, the photo-switch 1704 removes that conducting path between the reversible resistivity element 908 and the bit line 904.

Figure 18A:
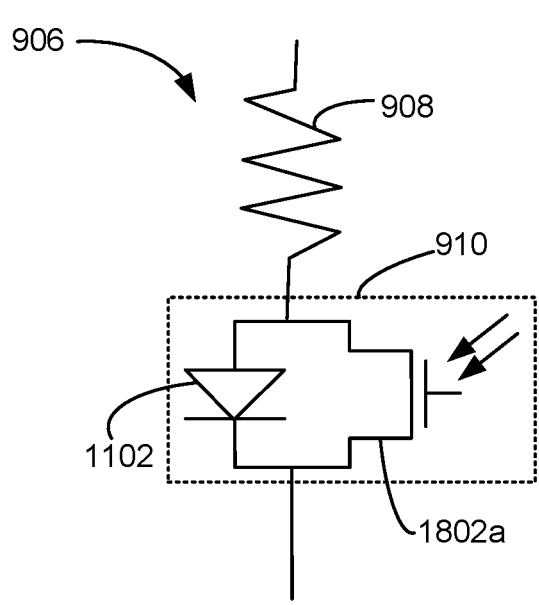
FIGS. 18A and 18B depict embodiments of memory cells that may be used in the cross-bar array of FIG. 17 in which the photo-switch is implemented with a photo-transistor.

In some embodiments, the photo-switch 1704 is implemented with a photo-transistor. FIG. 18A depicts one embodiment of a memory cell 906 that may be used in the cross-bar array 1700 of FIG. 17 in which the photo-switch 1704 is implemented with a photo-transistor. In the embodiment of FIG. 18A, the photo-switch 1704 is implemented with a photo field effect transistor (FET) 1802a. Applying light of a suitable wavelength will cause the photo-FET to be in a conductive state. When the light of the suitable wavelength is not provided to the photo-FET, the photo-FET will not be in a conductive state.

Figure 18B:
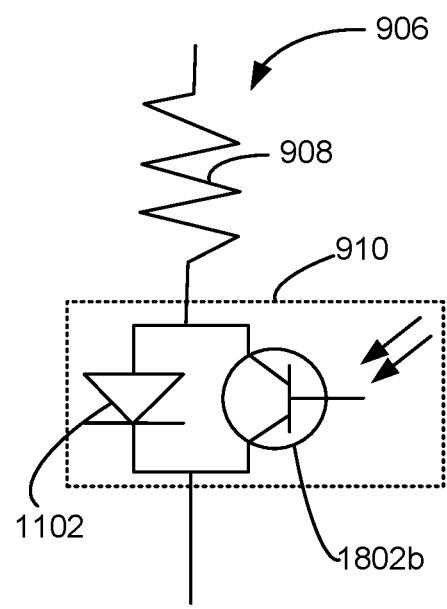

FIG. 18B depicts one embodiment of a memory cell 906 that may be used in the cross-bar array 1700 of FIG. 17 in which the photo-switch 1704 is implemented with a photo-transistor. In the embodiment of FIG. 18B, the photo-switch 1704 is implemented with a photo bipolar junction transistor (BJT) 1802b. Applying light of a suitable wavelength will cause the photo-BJT to be in a conductive state. When the light of the suitable wavelength is not provided to the photo-BJT, the photo-BJT will not be in a conductive state.

Note that because the photo-transistors 1802 are controlled by the light source 1702, in some embodiments, it is not required to have wiring to provide control voltages to control terminals of the photo-transistors 1802. For example, the photo-FET 1802a may be controlled without providing a voltage to its gate. Similarly, the photo-BJT 1802b may be controlled without providing a voltage to its base.

Figure 19:
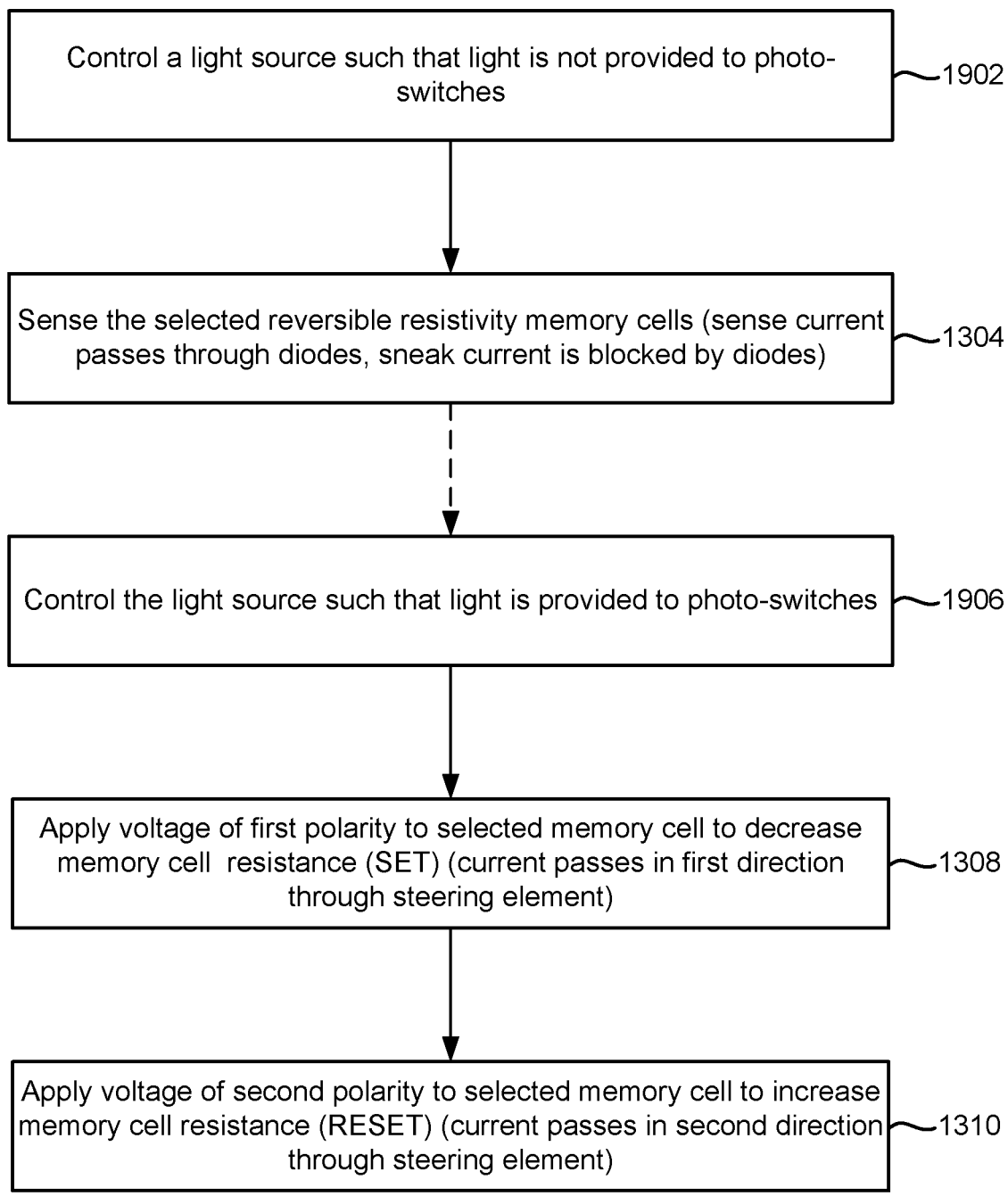
FIG. 19 is a flowchart of one embodiment of a process of operating steering elements in a cross-point array.

FIG. 19 is a flowchart of one embodiment of a process 1900 of operating steering elements 910 in a cross-point array. The process 1900 may be used to control a cross-point array 1700 having photo-switches 1704 in steering elements 910. The process 1900 provides further details for one embodiment of process 1300. In one embodiment, process 1900 is performed by memory structure control circuits 504. In one embodiment, memory structure control circuits 504 reside on memory die 292 with the memory structure 506. In one embodiment, memory structure control circuits 504 reside on control die 592, with the memory structure 506 residing on memory structure die 590. In FIG. 19, reference numerals 1304, 1308, and 1310 (which were used in FIG. 13) are used again to indicate that these steps may be similar to process 1300.

Step 1902 includes controlling a light source 1702 such that light is not provided to the photo-switches 1704. Step 1902 results in the photo-switches 1704 being in a non-conductive state (or open). In one embodiment, the light source 1702 is controlled such that no light is emitted from the light source 1702. Step 1902 is one embodiment of step 1302 (establishing conditions in the steering elements 910 for sensing one or more reversible resistivity memory cells 906). In one embodiment, the photo-switches 1704 of both selected and unselected memory cells 906 are made non-conductive. In one embodiment, the photo-switch 1704 of a given memory cell 906 being in the non-conductive state places the diode 1102 in a series connection with the reversible resistivity element 908.

Step 1304 includes sensing the selected memory cells 906. In step 1304, for each selected memory cell, any sense current will pass through the diode 1102 in the steering element 910 of that selected memory cell. However, sneak currents will be blocked by diodes 1102.

Step 1906 includes controlling the light source 1702 such that light is provided to the photo-switches 1704. Moreover, the light is of a suitable wavelength to place the photo-switches 1704 into a conductive state. Step 1906 is one embodiment of step 1306 (establishing conditions in the steering elements 910 for bipolar programming of one or more reversible resistivity memory cells 906). In one embodiment, the photo-switches 1704 are in the conductive state in the steering elements 910 of both selected and unselected memory cells 906. For example, the light source 1702 may be configured to provide light to both selected and unselected memory cells in at least one region of the memory array 1700. In one embodiment, having the photo-switches 1704 in the conductive state allows a current to flow in either direction through the photo-switches 1704.

Step 1308 includes applying a voltage having a first polarity to a selected memory cell to decrease the memory cell resistance. In one embodiment, step 1308 SETs the memory cell. In one embodiment step 1308, current flows through the photo-switches 1704 in a first direction. The current may also flow through the reversible resistivity element 908. Step 1310 includes applying a voltage having a second polarity to the selected memory cell to increase the memory cell resistance. In one embodiment, step 1310 RESETs the memory cell. In one embodiment of step 1310, current flows through the photo-switches 1704 in a second direction, which is opposite the first direction.

Figure 20:
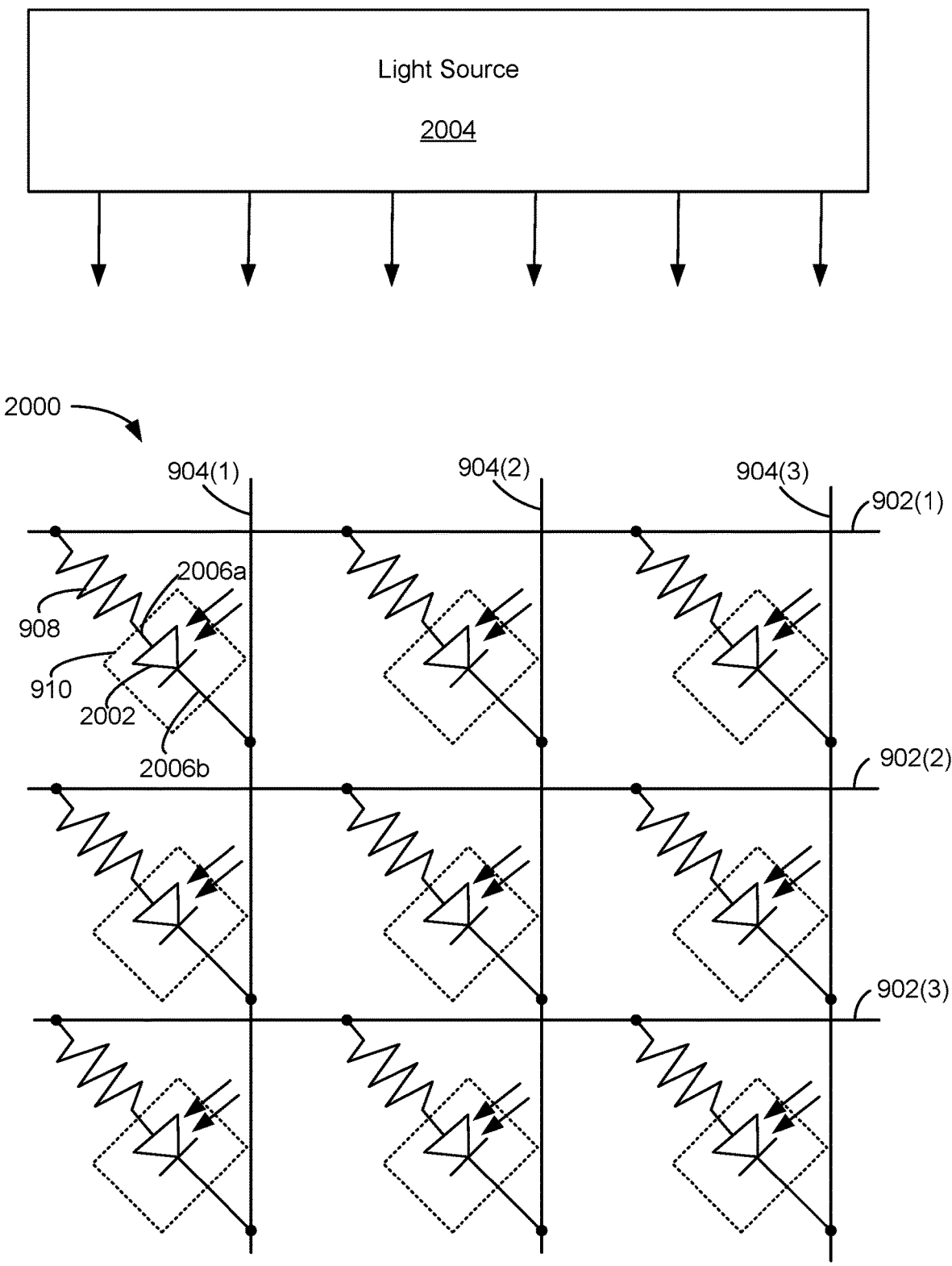
FIG. 20 depicts one embodiment of a cross-point array in which the steering elements each have a photo-diode that is controllable by a light source.

In some embodiments, the diode in the steering element 910 comprises a photo-diode. However, the steering element 910 is not required to have a switch in parallel with the photo-diode. FIG. 20 depicts one embodiment of a cross-point array 2000 in which the steering elements 910 each have a photo-diode 2002 that is controllable by a light source 2004. The light source 2004 is configured to output light at a wavelength that controls the photo-diodes 2002. In some embodiments, the light source 2004 uniformly illuminates the memory cells in at least one level of the cross-point array 2000. In one embodiment, a photo-diode 2002 is placed into a conductive state by application of light of a suitable wavelength (or range of wavelengths). In one embodiment, a photo-diode 2002 is placed into a non-conductive state when light of a suitable wavelength (or range of wavelengths) is not provided to the photo-diode 2002. The light source 2004, as well as the cross-point array 2000 may be controlled by memory structure control circuits 504.

In FIG. 20, the photo-diode 2002 has a first terminal 2006a connected to the reversible resistivity element 908, and a second terminal 2006b connected to the bit line 904(1). In FIG. 20, the anode of diode 2002 is connected to the reversible resistivity element 908 with the cathode connected to the bit line 904. However, the cathode of diode 2002 may be connected to the reversible resistivity element 908 with the anode connected to the bit line 904. In another embodiment, the positions of the photo-diode 2002 and the reversible resistivity element 908 may be reversed, such that the photo-diode 2002 is connected to a word line 902 and the reversible resistivity element 908 is connected to a bit line 904.

Figure 21:
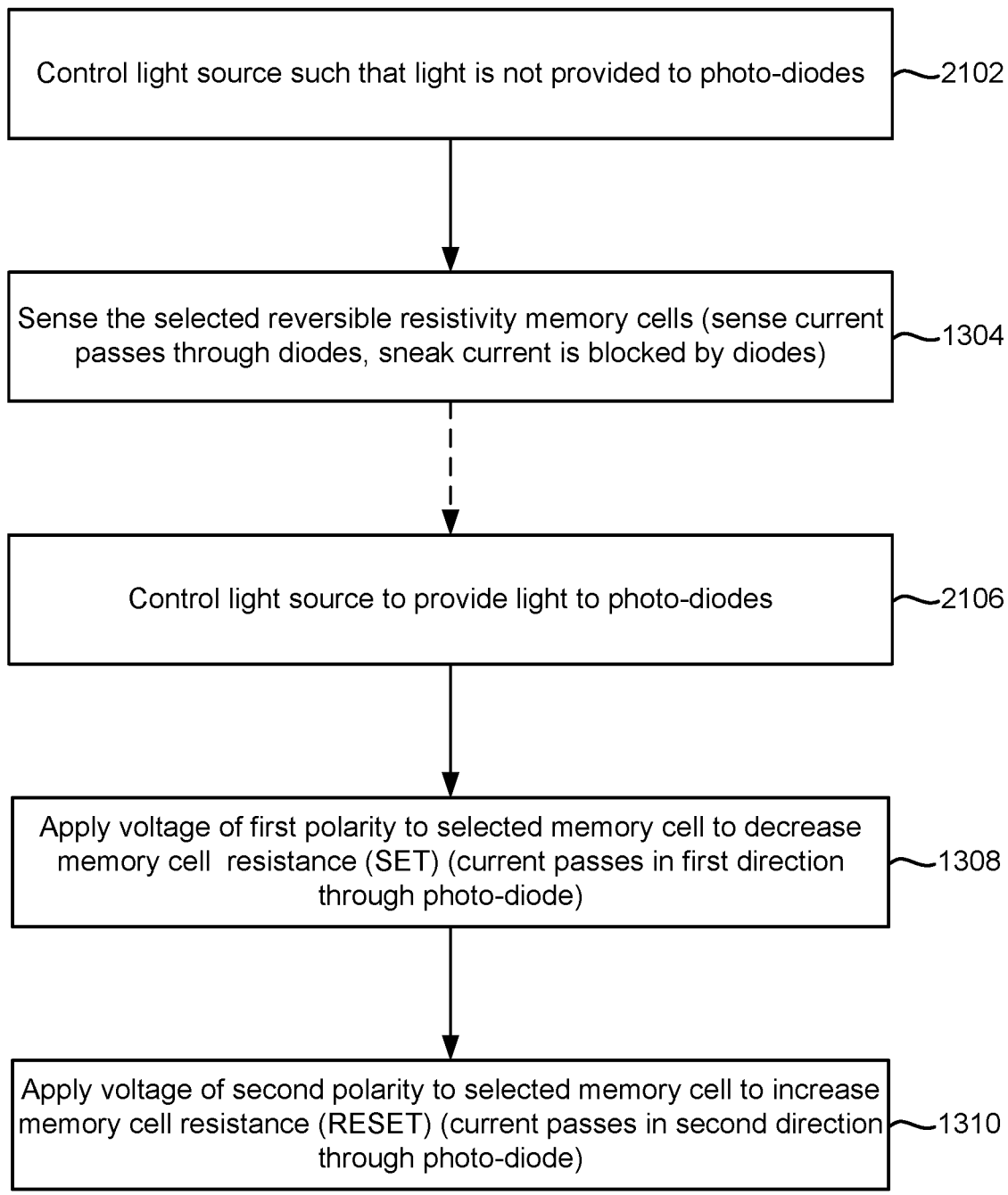
FIG. 21 is a flowchart of one embodiment of a process of operating steering elements in a cross-point array having a photo-diode in a steering element of a memory cell.

FIG. 21 is a flowchart of one embodiment of a process 2100 of operating steering elements 910 in a cross-point array having a photo-diode in a steering element of a memory cell. The process 2100 may be used to control cross-point array 2000. The process 2100 provides further details for one embodiment of process 1300. In one embodiment, process 2100 is performed by memory structure control circuits 504. In one embodiment, memory structure control circuits 504 reside on memory die 292 with the memory structure 506. In one embodiment, memory structure control circuits 504 reside on control die 592, with the memory structure 506 residing on memory structure die 590. In FIG. 21, reference numerals 1304, 1308, and 1310 (which were used in FIG. 13) are used again to indicate that these steps may be similar to process 1300.

Step 2102 includes controlling a light source 2004 such that light is not provided to the photo-diodes 2002. Step 2102 results in the photo-diodes 2002 being in a voltage-controlled mode. In the voltage-controlled mode, the photo-diodes 2002 will be forward biased if the anode voltage is greater than the cathode voltage by a diode forward bias threshold voltage. Thus, the photo-diodes 2002 will allow a current to pass in the forward bias direction. Therefore, the photo-diodes 2002 will allow a sense current to pass. In the configuration of FIG. 20, the photo-diodes 2002 will allow a sense current to pass from the reversible resistivity element 908 to the bit line 904. However, the photo-diodes 2002 will block sneak currents. In another configuration, in which the anode and cathode of the photo-diodes 2002 are reversed, the photo-diodes 2002 will allow a sense current to pass from the bit line 904 to the reversible resistivity element 908.

Step 2102 is one embodiment of step 1302 (establishing conditions in the steering elements 910 for sensing one or more reversible resistivity memory cells 906). In one embodiment, the photo-diodes 2002 of both selected and unselected memory cells 906 are placed into the voltage-controlled mode.

Step 1304 includes sensing the selected memory cells 906. In step 1304, for each selected memory cell, any sense current will pass through the photo-diode 2002 in the steering element 910 of that selected memory cell. However, sneak currents will be blocked by photo-diodes 2002.

Step 2106 includes controlling the light source 1702 such that light is provided to the photo-diodes 2002. Moreover, the light is of a suitable wavelength to place the photo-diodes 2002 into a conductive state. Step 2106 is one embodiment of step 1306 (establishing conditions in the steering elements 910 for bipolar programming of one or more reversible resistivity memory cells 906). In one embodiment, the photo-diodes 2002 are in the conductive state in the steering elements 910 of both selected and unselected memory cells 906. For example, the light source 2004 may be configured to provide light to both selected and unselected memory cells in at least one region of the memory array 2000. In one embodiment, having the photo-diodes 2002 in the conductive state allows a current to flow in either direction through the photo-diodes 2002.

Step 1308 includes applying a voltage having a first polarity to a selected memory cell to decrease the memory cell resistance. In one embodiment, step 1308 SETs the memory cell. In one embodiment step 1308, current flows through the photo-diodes 2002 in a first direction. The current may also flow through the reversible resistivity element 908. Step 1310 includes applying a voltage having a second polarity to the selected memory cell to increase the memory cell resistance. In one embodiment, step 1310 RESETs the memory cell. In one embodiment of step 1310, current flows through the photo-diodes 2002 in a second direction, which is opposite the first direction.

Figure 22:
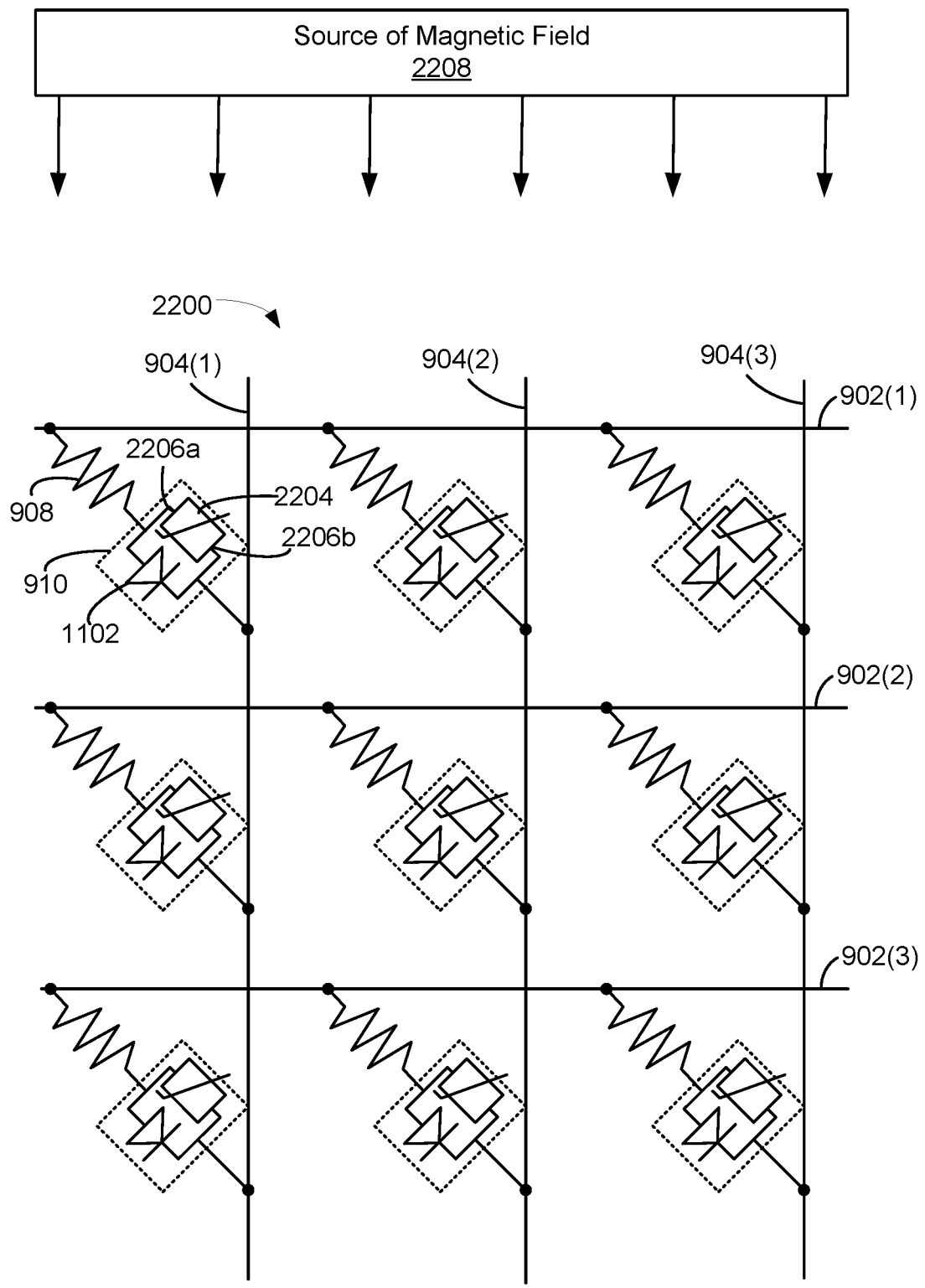
FIG. 22 depicts one embodiment of a cross-point array having a magneto-resistor in a steering element.

In some embodiments, the switch in the steering element comprises a magneto-resistor. A magneto-resistor, as the term is defined herein, is an electrical component that switches between a high resistance and a low resistance in response to a magnetic field. FIG. 22 depicts one embodiment of a cross-point array 2200 having a magneto-resistor in a steering element. The steering element 910 of each memory cell 906 has a magneto-resistor 2204 in parallel with a diode 1102. The magneto-resistor 2204 has a first terminal 2206a connected to the reversible resistivity element 908, and a second terminal 2206b connected to the bit line 904(1). There are a number of materials that may be used in the magneto-resistor 2204. In one embodiment, the magneto-resistor 2204 may comprise alternating layers of ferromagnetic and non-magnetic materials. In some embodiments, the magneto-resistor 2204 is formed from a material that exhibits what is commonly referred to as giant magnetoresistance (GMR). In some embodiments, the magneto-resistor 2204 comprises a magnetic tunnel junction (MTJ), which may comprise two ferromagnets separated by a thin insulator.

The magnetic field source 2208 is configured to output a magnetic field that controls the resistance of the magneto-resistors 2204. In some embodiments, the magnetic field source 2208 provides a uniform magnetic field to the memory cells in at least one level of the cross-point array 2200. In one embodiment, the magneto-resistors 2204 are placed into what is referred to herein as a conductive state by controlling the magnetic field source 2208 to lower the resistance of the magneto-resistors 2204. In one embodiment, the magneto-resistors 2204 are placed into what is referred to herein as a non-conductive state by controlling the magnetic field source 2208 to increase the resistance of the magneto-resistors 2204.

In FIG. 22, if the magneto-resistors 2204 has a sufficiently low resistance then the magneto-resistors 2204 provides a conducting path between the reversible resistivity element 908 and bit line 904. Thus, in one embodiment, if the magneto-resistors 2204 has a sufficiently low resistance then the magneto-resistors 2204 provides a conducting path between the reversible resistivity element 908 and word line 902. Thus, if the magneto-resistors 2204 has a sufficiently low resistance then the magneto-resistors 2204 provides a conductive path that bypasses the diode 1102. Moreover, current may flow through the magneto-resistor 2204 either to or from the bit line 904. Therefore, when the magneto-resistors 2204 has a sufficiently low resistance, bipolar programming of the memory cells 906 may be performed. The positions of the steering element 910 and the reversible resistivity element 908 can be switched such that the magneto-resistor 2204 is between the reversible resistivity element 908 and the word line 902. Thus, in some embodiments, when the magneto-resistor 2204 has a sufficiently low resistance, current may flow through the magneto-resistor 2204 either to or from the word line 902.

In FIG. 22, if the magneto-resistor 2204 has a sufficiently high resistance, then the magneto-resistor 2204 does not provide a conducting path between the reversible resistivity element 908 and bit line 904. Thus, if the magneto-resistor 2204 has a sufficiently high resistance, then the magneto-resistors 2204 does not provide a conductive path that bypasses the diode 1102. Therefore, when the magneto-resistor 2204 has a sufficiently high resistance, the sense current may flow through the diode 1102 to the bit line 904. However, the diodes 1102 block sneak currents from passing (in the direction from the cathode to anode of the diodes 1102).

Figure 23:
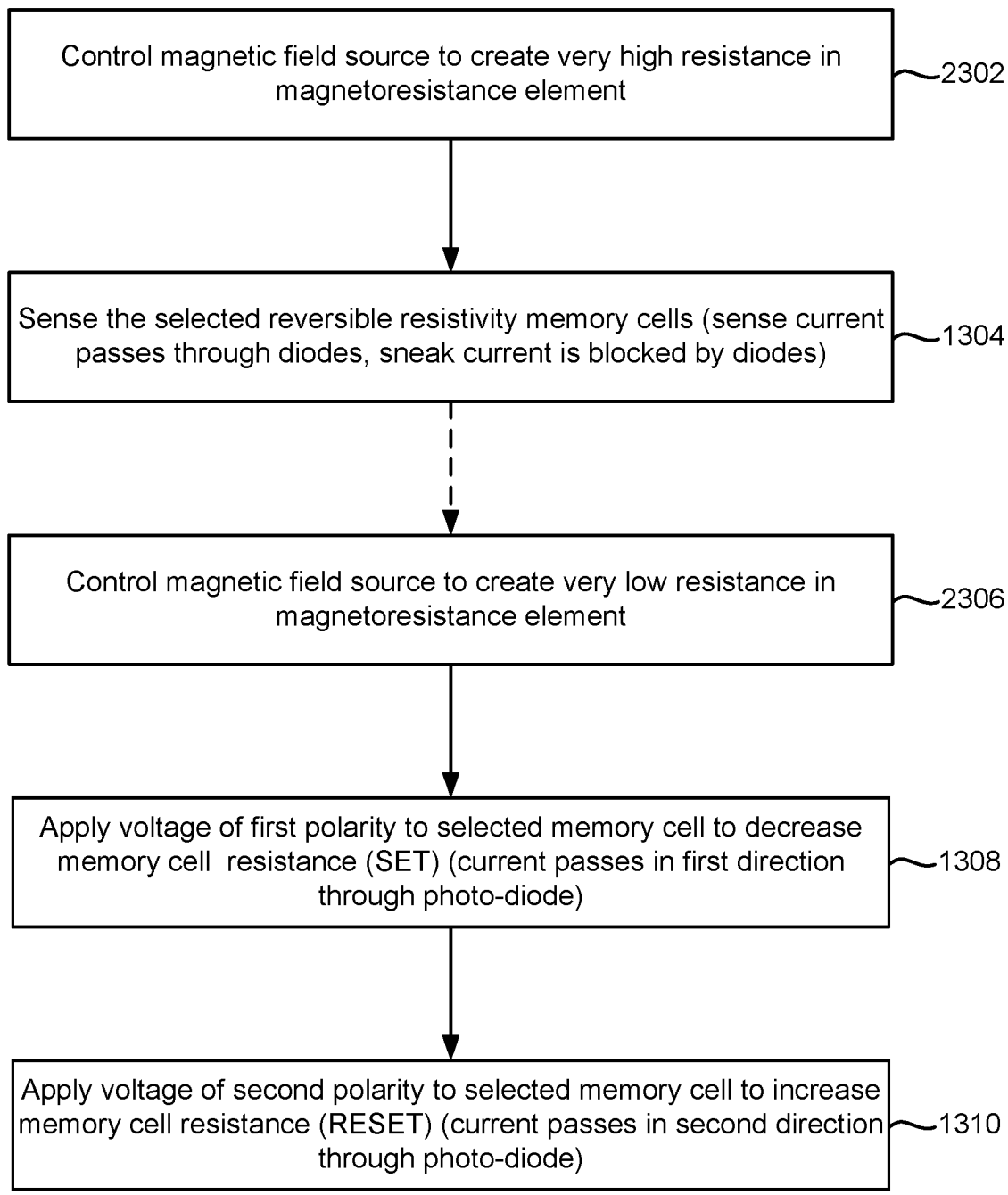
FIG. 23 is a flowchart of one embodiment of a process of operating steering elements in a cross-point array having magneto-resistors.

FIG. 23 is a flowchart of one embodiment of a process 2300 of operating steering elements 910 in a cross-point array having magneto-resistors. The process 2300 may be used to control cross-point array 2200 having magneto-resistors 2204 in steering elements 910. The process 2300 provides further details for one embodiment of process 1300. In one embodiment, process 2300 is performed by memory structure control circuits 504. In one embodiment, memory structure control circuits 504 reside on memory die 292 with the memory structure 506. In one embodiment, memory structure control circuits 504 reside on control die 592, with the memory structure 506 residing on memory structure die 590. In FIG. 23, reference numerals 1304, 1308, and 1310 (which were used in FIG. 13) are used again to indicate that these steps may be similar to process 1300.

Step 2302 includes controlling a magnetic field source 2208 to create a high resistance in the magneto-resistors 2204. In one embodiment, the resistance is sufficiently high such that the diodes 1102 will both pass any sense current and block sneak currents. Thus, the resistance of the magneto-resistors 2204 is sufficiently high such that the magneto-resistors 2204 will not pass a sneak current to a significant extent. That is, the magneto-resistors 2204 will have a resistance that is sufficiently high such that the magneto-resistors 2204 will not pass sneak currents that will interfere with accurate sensing of the selected memory cells.

In one embodiment, step 2302 results in the magneto-resistors 2204 being in what is referred to herein as non-conductive state. Step 2302 is one embodiment of step 1302 (establishing conditions in the steering elements 910 for sensing one or more reversible resistivity memory cells 906). In one embodiment, the magneto-resistors 2204 of both selected and unselected memory cells 906 are made non-conductive. In one embodiment, the magneto-resistors 2204 of a given memory cell 906 being in the non-conductive state places the diode 1102 in a series connection with the reversible resistivity element 908.

Step 1304 includes sensing the selected memory cells 906. In step 1304, for each selected memory cell, any sense current will pass through the diode 1102 in the steering element 910 of that selected memory cell. However, sneak currents will be blocked by diodes 1102. Moreover, the magneto-resistors 2204 will not pass sneak currents that will interfere with accurate sensing of the selected memory cells.

Step 2306 includes controlling the magnetic field source 2208 such that the magneto-resistors 2204 are placed into a low resistance state. Herein, this low resistance state may be referred to as a conductive state. When the magneto-resistors 2204 are in the low resistance (or conductive) state current may flow in either direction through the magneto-resistors 2204, such that bipolar programming of the memory cells 906 is possible. When in the low resistance (or conductive) state, the magneto-resistors 2204 provide a conductive path that bypasses the diodes 1102, such that the diodes 1102 do not interfere with bipolar programming. A suitable resistance for the conductive state may be determined based on factors such as the resistance of the memory cells 906 during bipolar programming.

Step 2306 is one embodiment of step 1306 (establishing conditions in the steering elements 910 for bipolar programming of one or more reversible resistivity memory cells 906). In one embodiment, the magneto-resistors 2204 are in the conductive state in the steering elements 910 of both selected and unselected memory cells 906. For example, the magnetic field source 2208 may be configured to provide a magnetic field to both selected and unselected memory cells in at least one region of the memory array 2200.

Step 1308 includes applying a voltage having a first polarity to a selected memory cell to decrease the memory cell resistance. In one embodiment, step 1308 SETs the memory cell. In one embodiment step 1308, current flows through the magneto-resistors 2204 in a first direction. The current may also flow through the reversible resistivity element 908. Step 1310 includes applying a voltage having a second polarity to the selected memory cell to increase the memory cell resistance. In one embodiment, step 1310 RESETs the memory cell. In one embodiment of step 1310, current flows through the magneto-resistors 2204 in a second direction, which is opposite the first direction.

As can be seen in view of the foregoing disclosure, a first embodiment includes an apparatus, comprising a control circuit configured to be connected to a cross-point array. The cross-point array comprise a plurality of first conductive lines and a plurality of second conductive lines. The cross-point array comprising memory cells, wherein each memory cell is connected to one of the first conductive lines and one of the second conductive lines. Each memory cell comprises a reversible resistivity element and a steering element comprising a diode. The control circuit is configured to sense read selected memory cells by operating the steering elements of the memory cells such that sense currents pass through the diodes and any sneak currents are blocked by the diodes. The control circuit is configured to perform bipolar programming by: applying a first program voltage having a first polarity to first program selected memory cells and operating the steering elements of the first program selected memory cells such that for each first program selected memory cell a first program current passes through the steering element to the reversible resistivity element of the selected memory cell; and applying a second program voltage having a second polarity to second program selected memory cells and operating the steering elements of the second program selected memory cells such that for each second program selected memory cell a second program current passes through the steering element from the reversible resistivity element of the second program selected memory cell.

In a second embodiment, and in furtherance to the first embodiment, each steering element comprises a switch connected in parallel with the diode. The control circuit is further configured to open the switches in the steering elements of the memory cells when sensing the read selected memory cells to place the reversible resistivity element of each memory cell in series with the diode in the steering element of the memory cell such that the diodes pass the sense currents and block any sneak currents. The control circuit is further configured to close the switches in the steering elements of the first and second program selected memory cells when programming such that for each first program selected memory cell the first program current passes through the steering element to the reversible resistivity element of the first program selected memory cell in response to the first program voltage and the second program current passes through the steering element from the reversible resistivity element of the second program selected memory cell in response to the second program voltage.

In a second embodiment, and in furtherance to the first or second embodiments, each steering element comprises a transistor connected in parallel with the diode. The control circuit is further configured to apply a voltage to a control terminal of the transistor in the steering elements of the memory cells to place the transistor in a non-conductive state when sensing the read selected memory cells. Placing the reversible resistivity element of each memory cell in series with the diode in the steering element of the memory cell configures the diodes to pass the sense currents and to block the sneak currents. The control circuit is further configured to apply a voltage to the control terminal of the transistor in the steering elements of the first and second program selected memory cells to place the transistors of the program selected memory cells in a conductive state when programming such that for each first program selected memory cell the first program current passes through the steering element to the reversible resistivity element of the first program selected memory cell in response to the first program voltage and such that for each second program selected memory cell the second program current passes through the steering element from the reversible resistivity element of the second program selected memory cell in response to the second program voltage.

In a fourth embodiment, and in furtherance to either the first or second embodiments, the apparatus further comprises a light source connected to the control circuit. The steering element comprises a photo-transistor connected in parallel with the diode. The control circuit is further configured to control the light source in order to apply light to the photo-transistor in the steering element of each memory cell to place the photo-transistors in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

In a fifth embodiment, and in furtherance to any of the first, second, or fourth embodiments, the control circuit is further configured to control the light source to place the photo-transistors in the steering elements of each memory cell in a non-conductive state when sensing the read selected memory cells to place the reversible resistivity element of each memory cell in series with the diode in the steering element of the memory cell. Placing the reversible resistivity element of each memory cell in series with the diode in the steering element of the memory cell configures the diodes to pass the sense currents and to block the sneak currents.

In a sixth embodiment, and in furtherance to either the first or second embodiments, the apparatus further comprises a light source connected to the control circuit. The diode in each steering element comprises a photo-diode. The control circuit is further configured to control the light source in order to apply light to the photo-diodes in the steering elements of each first and second program selected memory cell to place the photo-diodes in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

In a seventh embodiment, and in furtherance to any of the first, second or sixth embodiments, the control circuit is further configured to control the light source to place the photo-diode in the steering element of each memory cell in a voltage-controlled mode when sensing the read selected memory cells such that photo-diodes are configured to pass the sense currents and to block the sneak currents.

In an eighth embodiment, and in furtherance to either the first or second embodiments, the apparatus further comprises a magnetic field source connected to the control circuit. The steering element comprises a magneto-resistor connected in parallel with the diode. The control circuit is further configured to control the magnetic field source in order to apply a magnetic field to the magneto-resistor in the steering element of each memory cell to place the magneto-resistors in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

In a ninth embodiment, and in furtherance to any of the first, second or eighth embodiments, the control circuit is further configured to control the magnetic field source to place the magneto-resistor in the steering element of each memory cell in a non-conductive state when sensing the read selected memory cells to place the reversible resistivity element of each memory cell in series with the diode in the steering element of the memory cell, wherein placing the reversible resistivity element of each memory cell in series with the diode in the steering element of the memory cell configures the diodes to pass the sense currents and to block the sneak currents.

In a tenth embodiment, and in furtherance to any of the first to ninth embodiments, the apparatus further comprises a sense circuit coupled to the second conductive lines. The sense circuit is configured to sense memory cells that are connected to the same second conductive line together. The sense circuit is further configured to sense multiple second conductive lines in parallel.

One embodiment includes a method, comprising creating, for each of a plurality of reversible resistivity memory cells in a cross-point array, a series connection between a diode of a memory cell and a reversible resistivity element of the memory cell to establish a condition for sensing read selected reversible resistivity memory cells. The method comprises sensing the read selected reversible resistivity memory cells by applying sense voltages to the read selected reversible resistivity memory cells to pass sense currents through the diodes of the read selected reversible resistivity memory cells while blocking sneak currents in the cross-point array with the diodes. The method comprises creating a conductive path in parallel with the diode of a first program selected reversible resistivity memory cell to establish a condition for bipolar programming of the first program selected reversible resistivity memory cell. The method comprises applying a voltage having a first polarity to the first program selected reversible resistivity memory cell to SET the first program selected reversible resistivity memory cell with the conductive path in parallel with the diode of the first program selected reversible resistivity memory cell. The method comprises creating a conductive path in parallel with the diode of a second program selected reversible resistivity memory cell to establish a condition for bipolar programming of the second program selected reversible resistivity memory cell. The method comprises applying a voltage having a second polarity to the second program selected reversible resistivity memory cell to RESET the second program selected reversible resistivity memory cell with the conductive path in parallel with the diode of the second program selected reversible resistivity memory cell.

One embodiment includes a non-volatile memory system, comprising a cross-point array comprising a plurality of conductive row lines and a plurality of conductive column lines. The cross-point array comprises reversible resistivity memory cells. Each memory cell is connected between one of the conductive row lines and one of the conductive column lines, wherein each memory cell comprises a reversible resistivity element in series with a steering element. The steering element comprising a diode in parallel with a switch. The non-volatile memory system comprises a control circuit in communication with the cross-point array. The control circuit is configured to establish a sense condition by configuring the switches in a non-conductive state to place the diode of each memory cell in series with the reversible resistivity element of the respective memory cell. The control circuit is configured to sense read selected memory cells with the switches in the non-conductive state. The control circuit is configured to establish a bipolar programming condition by placing the switches in at least program selected memory cells in a conductive state, wherein the control circuit is configured to perform bipolar programming of the program selected memory cells with the switches in the conductive state.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a control circuit configured to be connected to a cross-point array comprising a plurality of first conductive lines and a plurality of second conductive lines, the cross-point array comprising memory cells, wherein each memory cell is connected to one of the first conductive lines and one of the second conductive lines, wherein each memory cell comprises a reversible resistivity element and a steering element comprising a diode;
   wherein the control circuit is configured to sense read selected memory cells by operating the steering elements of the memory cells such that sense currents pass through the diodes and any sneak currents are blocked by the diodes; and
   wherein the control circuit is configured to perform bipolar programming by:
      applying a first program voltage having a first polarity to first program selected memory cells and operating the steering elements of the first program selected memory cells such that for each first program selected memory cell a first program current passes through the steering element to the reversible resistivity element of the selected memory cell; and
      applying a second program voltage having a second polarity to second program selected memory cells and operating the steering elements of the second program selected memory cells such that for each second program selected memory cell a second program current passes through the steering element from the reversible resistivity element of the second program selected memory cell.

2. The apparatus of claim 1, wherein:
   each steering element comprises a switch connected in parallel with the diode;
   the control circuit is further configured to open the switches in the steering elements of the memory cells when sensing the read selected memory cells to place the reversible resistivity element of each memory cell in series with the diode in the steering element of the memory cell such that the diodes pass the sense currents and block any sneak currents; and
   the control circuit is further configured to close the switches in the steering elements of the first and second program selected memory cells when programming such that for each first program selected memory cell the first program current passes through the steering element to the reversible resistivity element of the first program selected memory cell in response to the first program voltage and the second program current passes through the steering element from the reversible resistivity element of the second program selected memory cell in response to the second program voltage.

3. The apparatus of claim 1, wherein:
   each steering element comprises a transistor connected in parallel with the diode;
   the control circuit is further configured to apply a voltage to a control terminal of the transistor in the steering elements of the memory cells to place the transistor in a non-conductive state when sensing the read selected memory cells, wherein placing the reversible resistivity element of each memory cell in series with the diode in the steering element of the memory cell configures the diodes to pass the sense currents and to block the sneak currents; and
   the control circuit is further configured to apply a voltage to the control terminal of the transistor in the steering elements of the first and second program selected memory cells to place the transistors of the program selected memory cells in a conductive state when programming such that for each first program selected memory cell the first program current passes through the steering element to the reversible resistivity element of the first program selected memory cell in response to the first program voltage and such that for each second program selected memory cell the second program current passes through the steering element from the reversible resistivity element of the second program selected memory cell in response to the second program voltage.

4. The apparatus of claim 1, further comprising a light source connected to the control circuit, wherein:
   the steering element comprises a photo-transistor connected in parallel with the diode; and
   the control circuit is further configured to control the light source in order to apply light to the photo-transistor in the steering element of each memory cell to place the photo-transistors in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

5. The apparatus of claim 4, wherein:
   the control circuit is further configured to control the light source to place the photo-transistors in the steering elements of each memory cell in a non-conductive state when sensing the read selected memory cells to place the reversible resistivity element of each memory cell in series with the diode in the steering element of the memory cell, wherein placing the reversible resistivity element of each memory cell in series with the diode in the steering element of the memory cell configures the diodes to pass the sense currents and to block the sneak currents.

6. The apparatus of claim 1, further comprising a light source connected to the control circuit, wherein:
the diode in each steering element comprises a photo-diode; and
the control circuit is further configured to control the light source in order to apply light to the photo-diodes in the steering elements of each first and second program selected memory cell to place the photo-diodes in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

7. The apparatus of claim 6, wherein:
the control circuit is further configured to control the light source to place the photo-diode in the steering element of each memory cell in a voltage-controlled mode when sensing the read selected memory cells such that photo-diodes are configured to pass the sense currents and to block the sneak currents.

8. The apparatus of claim 1, further comprising a magnetic field source connected to the control circuit, wherein:
the steering element comprises a magneto-resistor connected in parallel with the diode; and
the control circuit is further configured to control the magnetic field source in order to apply a magnetic field to the magneto-resistor in the steering element of each memory cell to place the magneto-resistors in a conductive state when programming such that for each first program selected memory cell the first program current passes through the steering element to the reversible resistivity element of the first program selected memory cell in response to the first program voltage and for each second program selected memory cell the second program current passes through the steering element from the reversible resistivity element of the second program selected memory cell in response to the second program voltage.

9. The apparatus of claim 8, wherein:
the control circuit is further configured to control the magnetic field source to place the magneto-resistor in the steering element of each memory cell in a non-conductive state when sensing the read selected memory cells to place the reversible resistivity element of each memory cell in series with the diode in the steering element of the memory cell, wherein placing the reversible resistivity element of each memory cell in series with the diode in the steering element of the memory cell configures the diodes to pass the sense currents and to block the sneak currents.

10. The apparatus of claim 1, further comprising a sense circuit coupled to the second conductive lines, wherein the sense circuit is configured to sense memory cells that are connected to the same second conductive line together, wherein the sense circuit is further configured to sense multiple second conductive lines in parallel.

11. A method, comprising:
creating, for each of a plurality of reversible resistivity memory cells in a cross-point array, a series connection between a diode of a memory cell and a reversible resistivity element of the memory cell to establish a condition for sensing read selected reversible resistivity memory cells;
sensing the read selected reversible resistivity memory cells by applying sense voltages to the read selected reversible resistivity memory cells to pass sense currents through the diodes of the read selected reversible resistivity memory cells while blocking sneak currents in the cross-point array with the diodes;
creating a conductive path in parallel with the diode of a first program selected reversible resistivity memory cell to establish a condition for bipolar programming of the first program selected reversible resistivity memory cell;
applying a voltage having a first polarity to the first program selected reversible resistivity memory cell to SET the first program selected reversible resistivity memory cell with the conductive path in parallel with the diode of the first program selected reversible resistivity memory cell;
creating a conductive path in parallel with the diode of a second program selected reversible resistivity memory cell to establish a condition for bipolar programming of the second program selected reversible resistivity memory cell; and
applying a voltage having a second polarity to the second program selected reversible resistivity memory cell to RESET the second program selected reversible resistivity memory cell with the conductive path in parallel with the diode of the second program selected reversible resistivity memory cell.

12. The method of claim 11, wherein sensing the read selected reversible resistivity memory cells by applying sense voltages to the read selected reversible resistivity memory cells to pass the sense currents through the diodes of the read selected reversible resistivity memory cells while blocking sneak currents in the cross-point array with the diodes comprises:
sensing multiple columns of read selected reversible resistivity memory cells in parallel.

13. The method of claim 11, wherein:
creating a series connection between a diode of a memory cell and a reversible resistivity element of the memory cell to establish a condition for sensing read selected reversible resistivity memory cells comprises placing a transistor connected in parallel with the diode into a non-conductive state; and
creating a conductive path in parallel with the diode of the first program selected reversible resistivity memory cell to establish a condition for bipolar programming of the first program selected reversible resistivity memory cell comprises placing the transistor of the first program selected reversible resistivity memory cell into a conductive state.

14. The method of claim 13, wherein:
the transistor connected in parallel with the diode of the first program selected reversible resistivity memory cell comprises a photo-transistor; and
placing the transistor of the first program selected reversible resistivity memory cell into the conductive state comprises providing light to the photo-transistor.

15. The method of claim 11, wherein:
creating a series connection between a diode of a memory cell and a reversible resistivity element of the memory cell to establish a condition for sensing read selected reversible resistivity memory cells comprises placing a magneto-resistor connected in parallel with the diode into a non-conductive state; and creating a conductive path in parallel with the diode of the first program selected reversible resistivity memory cell to establish a condition for bipolar programming of the first program selected reversible resistivity memory cell comprises placing the magneto-resistor connected in parallel with the diode of the first program selected reversible resistivity memory cell into a conductive state.

16. A non-volatile memory system, comprising:

a cross-point array comprising a plurality of conductive row lines and a plurality of conductive column lines, the cross-point array comprising reversible resistivity memory cells, wherein each memory cell is connected between one of the conductive row lines and one of the conductive column lines, wherein each memory cell comprises a reversible resistivity element in series with a steering element, wherein the steering element comprising a diode in parallel with a switch; and a control circuit in communication with the cross-point array, wherein the control circuit is configured to establish a sense condition by configuring the switches in a non-conductive state to place the diode of each memory cell in series with the reversible resistivity element of the respective memory cell, wherein the control circuit is configured to sense read selected memory cells with the switches in the non-conductive state;

wherein the control circuit is configured to establish a bipolar programming condition by placing the switches in at least program selected memory cells in a conductive state, wherein the control circuit is configured to perform bipolar programming of the program selected memory cells with the switches in the conductive state.

17. The non-volatile memory system of claim 16, wherein the control circuit is configured to sense a plurality of columns of the read selected memory cells with the switches in the non-conductive state.

18. The non-volatile memory system of claim 16, wherein:

the switch in the steering element in the memory cells comprises a transistor;

the control circuit is configured to place the transistor of each memory cell into a non-conductive state to sense the read selected memory cells; and the control circuit is configured to place the transistor of at least the program selected memory cells into a conductive state to perform the bipolar programming of the program selected memory cells.

19. The non-volatile memory system of claim 16, further comprises a light source, wherein:

the switch in the steering element in the memory cells comprises a photo-transistor;

the control circuit is configured to control the light source to place the photo-transistor of each memory cell into a non-conductive state to sense the read selected memory cells; and the control circuit is configured to control the light source to place the photo-transistor of at least the program selected memory cells into a conductive state to perform the bipolar programming of the program selected memory cells.

20. The non-volatile memory system of claim 16, further comprises a magnetic field source configured to provide a magnetic field, wherein:

the switch in the steering element in the memory cells comprises a magneto-resistor;

the control circuit is configured to control the magnetic field to place the magneto-resistor of each memory cell into a non-conductive state to sense the read selected memory cells; and the control circuit is configured to control the magnetic field source to place the magneto-resistor of at least the program selected memory cells into a conductive state to perform the bipolar programming of the program selected memory cells.

\* \* \* \* \*